United States Patent [19]
Nakamura et al.

[11] Patent Number: 5,773,851
[45] Date of Patent: Jun. 30, 1998

[54] SEMICONDUCTOR DEVICE AND MANUFACTURING METHOD THEREOF

[75] Inventors: Hideki Nakamura; Tadaharu Minato, both of Hyogo, Japan

[73] Assignee: Mitsubishi Denki Kabushiki Kaisha, Tokyo, Japan

[21] Appl. No.: 873,029

[22] Filed: Jun. 11, 1997

[30] Foreign Application Priority Data

Jun. 11, 1996 [JP] Japan ...................................... 8-149261

[51] Int. Cl.$^6$ .......................... H01L 29/74; H01L 31/111
[52] U.S. Cl. .......................... 257/133; 257/135; 257/146
[58] Field of Search .................................... 257/133, 135, 257/146, 331, 332, 334

[56] References Cited

U.S. PATENT DOCUMENTS 5,508,534  4/1996  Nakamara et al. ...................... 257/135
5,554,862  9/1996  Omura et al. ............................ 257/137

FOREIGN PATENT DOCUMENTS 7-93434  10/1995  Japan .

OTHER PUBLICATIONS

"600V Trench IGBT in Comparison with Planar IGBT—An Evaluation of the Limit of IGBT Performance", Harada et al., Proceedings of the 6th International Symposium on Power Semiconductor Devices & ICs, 1994, pp. 411–416.

"A 4500V Injection Enhanced Insulated Gate Bipolar Transistor (IEGT) Operating in a Mode Similar to a Thyristor", Kitagawa et al., International Electron Devices Meeting, 1993, pp. 679–682.

*Primary Examiner*—Ngân V. Ngô
*Attorney, Agent, or Firm*—McDermott, Will & Emery

[57] ABSTRACT

An n-drift region, a p-base region, and an n-emitter region are formed in a semiconductor substrate. A trench is formed to be in contact with n-emitter region and p-base region, and a gate electrode is formed in trench with an insulated gate layer interposed. A first metal electrode layer electrically connected to n-emitter region, and a second metal electrode layer electrically connected to p-base region are provided. A direct current power source apparatus is connected to first and second metal electrode layers. Accordingly, on-state voltage can be reduced.

16 Claims, 19 Drawing Sheets

SEMICONDUCTOR DEVICE AND MANUFACTURING METHOD THEREOF

BACKGROUND OF THE INVENTION

1. Field of the Invention

The present invention relates to a semiconductor device and a method of manufacturing the same, and more particularly, to a vertical type Insulated Gate Bipolar Transistor (hereinafter referred to as "IGBT") having a trench gate structure.

2. Description of the Background Art

Generally, IGBT is employed as an element for controlling a motor or for switching in an inverter or the like. IGBT is a voltage drive element provided with both properties of low on-state voltage drop of a bipolar transistor and high speed switching of an MOSFET, characterized by that the loss of driving power and the loss at the on/off switching are small. Different from the IGBT having a planar gate structure, the IGBT provided with the trench gate structure allows decrease in on-state voltage drop through micronization of the MOSFET formed on a chip surface and improvement of its integrity. Thus, it comes to be widely used.

Now, a conventional vertical n-channel IGBT having a trench gate structure is described. FIG. 33 is a cross section of the conventional vertical n-channel IGBT having a trench gate structure.

With reference to FIG. 33, an n-drift region 1 is formed at a major surface 14a of an intrinsic or first conductivity type semiconductor substrate 14. A p-base region 2 is selectively formed at the surface of n-drift region 1. An n-emitter region 3 is selectively formed at the surface of p-base region 2. A trench 4 is provided extending from the first major surface 14a of semiconductor substrate 14 to n-drift region 1. Trench 4 is formed such that it penetrates n-emitter region 3 and p-base region 2 in the depth direction of semiconductor substrate 14.

A gate electrode 6 is provided in trench 4 with an insulated gate layer 5 interposed. The portion where p-base region 2 is adjacent to trench 4 is a channel formation region 2a. On the first major surface 14a of semiconductor substrate 14, an insulating layer 7 is formed to cover gate electrode 6. Contact holes 7a and 7b are respectively formed at insulating layer 7. A metal electrode layer 8 is provided to extend from contact holes 7a and 7b onto insulating layer 7. Metal electrode layer 8 is in ohmic contact with p-base region 2 and n-emitter region 3, and p-base region 2 and n-emitter region 3 are short circuited by metal electrode layer 8.

On the other hand, a p-collector region 10 is formed at a second major surface 14b of semiconductor substrate 14. A metal electrode layer 11 is provided in ohmic contact with the surface of p-collector region 10.

A description of the operational principle of the conventional vertical n-channel IGBT having above described structure is given. The operation will be described divided into four processes, that is, a transition from OFF (cut-off) state to ON (conductive) state, a steady state, a transition from ON state to OFF state, and an OFF state.

(1) Transition from OFF state to ON state

In order to change IGBT from OFF state to ON state, positive voltage is applied to metal electrode layer 11 connected to p-collector region 10, metal electrode layer 8 connected to n-emitter region 3 is grounded, and positive voltage is applied to gate electrode 6. An n-channel is thus formed in channel formation region 2a. Electrons are injected from n-emitter region 3 into n-drift region 1 through the n-channel, These electrons flow toward p-collector region 10. When these electrons reach p-collector region 10, holes are injected from p-collector region 10 to n-drift region 1. These holes move toward n-emitter region 3 of ground potential, and reach the portion where the n-channel is in contact with n-drift region 1. This process is called a storage process, and the time required for this process is called turn-on delay time. The power loss during this process is extremely small and negligible.

After electrons and holes are sufficiently accumulated as described above, a pair of electron-hole produces a low-resistance state referred to as conductivity modulation. The turn-on operation is then completed. This process is called a rise process, and the time required for the process is called rise time. The power loss during this process is relatively large.

(2) On state

The steady state after the completion of the turn-on operation is called ON state, and the voltage when the current of 100 A/cm$^2$ flows is called on-state voltage. The voltage loss during this ON state is referred to as an ON loss or a steady loss, and represented by the product of forward voltage drop generated by a resistor element and ON current. Power loss during this ON state is generally significantly large.

Next referring to FIG. 34, the resistance element during ON state is described. The resistance during ON state is determined by the sum of each resistance element located between metal electrode layers 8 and 11. The resistance R during ON state is specifically represented by the following expression.

$$R = R_{cn} + R_n + R_{ch} + R_a + R_d + R_{diode} + R_s + R_{cp}$$

In above expression, Rcn denotes the contact resistance between n-emitter region 3 and metal electrode layer 8, Rn denotes the resistance of n-emitter region 3, Rch denotes the resistance of the n-channel, Ra denotes the resistance of the accumulated layer, Rd denotes the resistance of n-drift region 1, Rdiode represents the forward voltage drop of the diode between collector region 10 and n-drift region 1, Rs represents the resistance of p-collector region, and Rcp represents the contact resistance between p-collector region 10 and metal electrode layer 11. Ic, Ih, and Ie shown in FIG. 34 respectively denote the collector current of IGBT, the hole current, and the electron current.

(3) Transition from ON state to OFF state

In order to change ON state to OFF state, the voltage below the threshold voltage of MOS transistor along trench 4 is applied to gate electrode 6. Through the application of such voltage to gate electrode 6, the n-channel formed in trench side wall 2a disappears. The supply of electrons from n-emitter region 3 to n-drift region 1 is then stopped. This process is called storage process, and the time required for the process is called delay time or turn-off delay time. The power loss during this process is extremely small and negligible.

After the supply of electrons is stopped, the concentration of electrons gradually decreases in the region adjacent to n-emitter region 3. The number of holes injected to n-drift region 1 for maintaining the electrically neutral condition also begins to decrease. A depletion layer then begins to expand at the interface between p-base region 2 and n-drift region 1. The depletion layer expands to a thickness corresponding to the amount of the voltage applied to metal electrode layers 8 and 11. This loss is significantly large as the power loss during the above described ON state.

After the depletion layer expands sufficiently at the interface between p-base region 2 and n-drift region 1, the holes outside the depleted region reach metal electrode layer 8 through the depleted region and p-base region 2. The turn-off process is then completed. This process is called tail process, and the time required for the process is called tail time. The power loss during this process is referred to as tail loss. The power loss during this process is significantly large.

(4) OFF state

The steady state after the completion of above described turn-off process is called OFF state. The power loss in this state is generally very small and negligible.

As described above, each process of the conventional trench IGBT has power loss. It is preferable that any of these process losses can be reduced. FIG. 35 shows a first improved modification of IGBT capable of reducing the power loss during ON state.

Referring to FIG. 35, according to the first improved modification, a plurality of trenches 4a, 4b, 4c, and 4d are formed at the first major surface 14a of semiconductor substrate 14, and p-base regions 2 are respectively formed between trenches 4a and 4b, and trenches 4c and 4d. At the surface of p-base region 2, n-emitter regions 3 are formed spaced apart. An insulated gate layer 5b and a gate electrode 6b are provided extending from trench 4b to trench 4c, and insulated gate layers 5c and 5a and gate electrodes 6c and 6a are respectively formed in trenches 4d and 4a. The structure except that described above is almost similar to that of the conventional IGBT shown in FIG. 33.

IGBT shown in FIG. 35 allows the supply of electrons to the region located between trenches 4b and 4c during ON state. In other words, the region which supplies electrons is expanded compared with the region shown in FIG. 33. The electrons can be supplied efficiently during ON state, and ON resistance can be reduced accordingly. As a result, the reduction of on-state voltage, as well as the reduction of the power loss during ON state are possible.

However, the first improved modification described above has a problem of the longer transition time to OFF state. The reason is as follows. During the transition to OFF state, holes reach metal electrode layer 8 through p-base region 2. In the first improvement shown in FIG. 35, the region where holes can be drawn out therethrough is reduced. Then the transition time to OFF state could become longer than that of IGBT shown in FIG. 33. The second improved modification shown in FIG. 36 is proposed in order to shorten the transition time to OFF state.

According to the second improved modification shown in FIG. 36, a p type hole draw out region 26 is provided between trenches 4c and 4d. The structure other than that is almost similar to the first improvement shown in FIG. 35.

Holes can be more efficiently drawn out than the first improvement by the provision of hole draw out region 26, resulting in the reduction of the transition time to OFF state.

However, the region which supplies electrons during ON state in the second improvement is smaller than the corresponding region in the first improvement because of the presence of hole draw out region 26. ON resistance thus becomes higher than that in the first improvement, and on-state voltage also becomes higher.

Generally, IGBT further has a problem of latch up in addition to the problems described above. The problem of latch up is found in the second improvement as well as the conventional example shown in FIG. 33 and the first improvement in FIG. 35. The latch up phenomenon will be hereinafter described with reference to FIG. 37.

FIG. 37 is an equivalent circuit of IGBT. Referring to FIG. 37, an npn bipolar transistor Tr1 is constituted by emitter region 3, p-base region 2, and n-drift region 1, and a pnp bipolar transistor Tr2 is constituted by p-base region 2, n-drift region 1 and p-collector region 10.

The latch up phenomenon occurs when there is a positive feedback between parasitic npn bipolar transistor Tr1 and pnp bipolar transistor Tr2 when parasitic npn bipolar transistor Tr1 is ON. When hole current Ih flows from n-drift region 1 to p-base region 2, n-emitter region 3 and p-base region 2 are set to a forward biased state by the voltage drop generated by a resistance element $R_B$ in p-base region 2. When the voltage drop exceeds the built-in voltage of the npn bipolar transistor (generally about 0.7 V in the case of an npn bipolar transistor formed on a silicon wafer), electrons are directly injected from n-emitter region 3 to p-base region 2, resulting in the latch up phenomenon. Once the latch up phenomenon occurs, the control of the current flowing through the device (IGBT) by the voltage applied to the gate electrode becomes impossible and the device could be broken down. Therefore, the latch up phenomenon must be avoided.

SUMMARY OF THE INVENTION

The present invention is made to solve the problems described above. An object of the present invention is to provide a semiconductor device and a manufacturing method thereof in which the latch up phenomenon is prevented, on-state voltage is reduced, and the transition time to OFF state is also reduced.

A semiconductor device according to this invention is provided with opposing first and second major surfaces, and controls conduction/cut-off of the current flowing between the first and second major surfaces. The semiconductor device according to one aspect of the present invention includes a semiconductor substrate having first and second major surfaces, a first impurity region of a first conductivity type (e.g. n type), a second impurity region of a second conductivity type (e.g. p type), a third impurity region of the first conductivity type, a trench, a gate electrode, forward bias means, and a fourth impurity region of the second conductivity type. The first impurity region is formed to extend from the first major surface into the semiconductor substrate. The second impurity region is selectively formed within the first impurity region. The third impurity region is selectively formed within the second impurity region. The trench extends from the first major surface into the semiconductor substrate in contact with both of the second and the third impurity regions, and has its bottom surface within the first impurity region. The gate electrode is formed in the trench with an insulated gate layer interposed. The forward bias means provide forward bias to the pn junction between the second and the third impurity regions during conduction (ON state). The fourth impurity region is formed to extend from the second major surface into the semiconductor substrate.

As is described, the semiconductor device according to one aspect of the present invention is provided with forward bias means. The forward bias means makes it possible to apply the forward bias to the pn junction between the second and third impurity regions during conduction. The potential of the second impurity region can thus be increased, and further injection of electrons from the third impurity region to the second impurity region becomes possible. The higher potential of the second impurity region allows the increased potential of the pn junction between the first and the second impurity regions. The injection of the holes from the first impurity region to the second impurity region can be promoted. As a result, the storage of carriers in the first and the second impurity regions can be increased, resulting in the higher concentration of the carriers in the first and second impurity regions. The resistance of the semiconductor device during conduction can be reduced, and on-state voltage of the semiconductor device can also be reduced. Through the reduction of on-state voltage, the increase of on-state voltage can be effectively suppressed even if hole draw out region 26 is formed as shown in FIG. 36.

Preferably, the voltage applied to the pn junction between the second and third impurity regions by the forward bias means is smaller than the built-in voltage of the pn junction. The latch up of the semiconductor device can thus be effectively prevented.

On the first major surface, preferably a first electrode layer electrically connected to the second impurity region is formed, and a second electrode layer connected to the third impurity region is provided. The forward bias means is electrically connected to the first and the second electrode layers, and may be a direct current power source for maintaining the potential of the second impurity region relatively higher than the potential of the first impurity region. On the second major surface, a third electrode layer electrically connected to the fourth impurity region is formed. By utilizing the direct current power source as the forward bias means, the forward bias can be applied to the pn junction between the second and third impurity regions, and the voltage applied to the pn junction between the second and the third impurity regions can be maintained smaller than the built-in voltage of the pn junction. The occurrence of the latch up can accordingly be prevented, and the reduction of on-state voltage can also be realized.

The second electrode layer is preferably constituted by a metal layer formed in ohmic contact with the surface of the third impurity region, and the first electrode layer is preferably constituted by a metal layer formed in ohmic contact with the surface of the second impurity region. Between the first and second electrode layers, an insulating layer is preferably provided extending from the first major surface to the region between the first and the second electrode layers.

The first electrode layer electrically connected to the second and the third impurity regions may be provided on the first major surface. In this case, the forward bias means may include voltage drop means interposed between the first electrode layer and the second impurity region. On the second major surface, the second electrode layer electrically connected to the fourth impurity region is formed. The voltage drop means interposed between the first electrode layer and the second impurity region can cause voltage drop as current passes through the voltage drop means during conduction of the semiconductor device. As a result, the potential of the second impurity region can be made higher than the potential of the third impurity region, then the injection of electrons from the third impurity region to the second impurity region, and the injection of holes from the fourth impurity region to the second impurity region can be easily performed. The reduction of on-state voltage of the semiconductor device can accordingly be realized.

It is noted that the voltage drop means may be constituted by a resistive layer having a resistance higher than the sheet resistance of the second impurity region.

The voltage drop means may be constituted by a Schottky junction formed between the second impurity region and the first electrode layer.

A semiconductor device according to another aspect of the present invention includes a semiconductor substrate having the first and the second major surfaces, a first impurity region of the first conductivity type, a second impurity region of the second conductivity type, a third impurity region of the first conductivity type, first, second, and third trenches, first and second gate electrodes, forward bias means, and a fourth impurity region of the second conductivity type. The first impurity region is formed to extend from the first major surface into the semiconductor substrate. The second impurity region is selectively formed from the first major surface into the first impurity region. The third impurity region is selectively formed from the first major surface into the second impurity region. The first and the second trenches extend from the first major surface into the semiconductor substrate in contact with both of the second and third impurity regions, have their bottom surfaces within the first impurity region, and formed at both sides of the third impurity region. The third trench is formed opposite to the first trench with the second trench in between, spaced apart from the second trench, extends from the first major surface into the semiconductor substrate, and has its bottom surface within the first impurity region. The first gate electrode is provided within the first trench with first insulated gate layer interposed. The second gate electrode is formed extending from the second trench via the first major surface into the third trench with the second insulated gate layer interposed. The forward bias means provide the forward bias to the pn junction between the second and the third impurity regions during conduction. The fourth impurity region is formed to extend from the second major surface into the semiconductor substrate.

Similar to the semiconductor device according to one aspect of the present invention described above, the semiconductor device according to another aspect of the invention is also provided with the forward bias means, allowing the reduction of on-state voltage of the semiconductor device. The semiconductor device in another aspect described above is further provided with the third trench spaced apart from the second trench, and the second gate electrode is provided to extend from the second trench into the third trench. During conduction, electrons can be supplied from the first region located between the second and the third trenches, resulting in the further reduction of on-state voltage compared with the case of one aspect of the invention described above.

Preferably, the voltage applied by the forward bias means to the pn junction between the second and the third impurity regions is also lower than the built-in voltage of the pn junction in another aspect of the invention. The latch up phenomenon is effectively suppressed.

On the first major surface, preferably, a first electrode layer electrically connected to the second impurity region is formed, and a second electrode layer electrically connected to the third impurity region is formed. In this case, the forward bias means is preferably connected to the first and second electrode layers, and includes a direct current power source for maintaining the potential of the second impurity region relatively higher than that of the first impurity region. On the second major surface, a third electrode layer electrically connected to the fourth impurity region is provided.

A fifth impurity region of the second conductivity type for drawing out holes therethrough may be provided in contact with the third trench, opposite to the second trench with the third trench inbetween. The fifth impurity region extends from the first major surface into the first impurity region. The fifth impurity region makes it possible to draw out holes during the switching operation from ON state to OFF state. The power loss during the switching operation can thus be reduced.

In addition to the structure in another aspect of the invention described above, a fourth trench, a third gate electrode, a fifth impurity region of the second conductivity type, and a sixth impurity region of the first conductivity type may further be formed. The fourth trench is formed opposite to the second trench with the third trench inbetween, spaced apart from the third trench, extends from the first major surface into the semiconductor substrate, and has its bottom surface within the first impurity region. The third gate electrode is formed in the fourth trench with a third insulated gate layer interposed. The fifth impurity region is formed in the first impurity region located between the third and the fourth trenches, in contact with both of the third and the fourth trenches and reaching to the first major surface. The sixth impurity region is selectively formed within the fifth impurity region to reach the first major surface, and in contact with one of the third and the fourth trenches.

Between the second and the third trenches in another aspect of the invention described above, a fourth trench having its bottom surface within the first impurity region may be formed to extend from the first major surface into the semiconductor substrate. Preferably, the second insulated gate layer and the second gate electrode extend into the fourth trench. On-state voltage can further be reduced by providing the fourth trench.

On the first major surface in another aspect of the invention, a first electrode layer electrically connected to the second and third impurity regions may be provided. In this case, the forward bias means preferably includes voltage drop means interposed between the second impurity region and the first electrode layer. On the second major surface, a second electrode layer electrically connected to the fourth impurity region is provided. The voltage drop means allows reduction of on-state voltage of the semiconductor device as one aspect of the invention.

The voltage drop means may be a resistance layer having resistance higher than the sheet resistance of the second impurity region.

The voltage drop means may include a Schottky junction formed between the second impurity region and the first electrode layer.

A method of manufacturing a semiconductor device according to the present invention is to provide a semiconductor device having the first and second major surfaces in which conduction/cut-off of the current between the first and second major surfaces is controlled. In the method of manufacturing a semiconductor device according to one aspect of the invention, a semiconductor substrate having the first and the second major surfaces is prepared. A first impurity region of the first conductivity type is formed to extend from the first major surface into the semiconductor substrate. A second impurity region of the second conductivity type is selectively formed in the first impurity region to reach the first major surface. A third impurity region of the first conductivity type is selectively formed in the second impurity region to reach the first major surface. A trench is provided in contact with the second and the third impurity regions to extend from the first major surface into the semiconductor substrate and has its bottom surface in the first impurity region. A gate electrode is formed in the trench with an insulated gate layer interposed. A first metal layer is formed on the surface of the third impurity region. The first metal layer is patterned to expose the surface of the second impurity region. An insulating layer is provided to cover the patterned first metal layer. A second metal layer is formed on the insulating layer and the surface of the second impurity region. A fourth impurity region of the second conductivity type is formed to extend from the second major surface into the semiconductor substrate. A third metal layer is formed on the surface of the fourth impurity region. A direct current power source apparatus electrically connected to the first and the second metal layers is provided.

In the method of manufacturing a semiconductor device according to one aspect of the present invention, the first and the second metal layers are formed in separate steps and the insulating layer is provided therebetween. The direct current power source apparatus can then be provided to be electrically connected to the first and the second metal layers. Accordingly, a semiconductor device which allows prevention of the latch up and reduction of on-state voltage can be obtained.

In a method of manufacturing a semiconductor device according to another aspect of the present invention, a semiconductor substrate having the first and the second major surfaces is prepared. A first impurity region of the first conductivity type is formed to extend from the first major surface into the semiconductor substrate. A second impurity region of the second conductivity type is selectively formed in the first impurity region to reach the first major surface. A third impurity region of the first conductivity type is selectively formed in the second impurity region to reach the first major surface. A trench is formed in contact with both of the second and the third impurity regions to extend from the first major surface into the semiconductor substrate, having its bottom surface in the first impurity region. A gate electrode is provided in the trench with an insulated gate layer interposed. At the surface of the second impurity region, a voltage drop region where voltage drop occurs is formed. A first metal layer is formed to extend from the surface of the third impurity region onto the surface of the voltage drop region. A fourth impurity region of the second conductivity type is formed to extend from the second major surface into the semiconductor substrate. A second metal layer is provided on the surface of the fourth impurity region.

As described above, in the method of manufacturing a semiconductor device according to another aspect of the invention, the voltage drop region is provided at the surface of the second impurity region. The voltage drop region can be constituted by a polysilicon layer containing impurities of low concentration, Schottky junction portion, or the like. The voltage drop region makes it possible to reduce on-state voltage of the semiconductor device. Different from above described one aspect of the invention, the process of manufacturing can be simplified since the separate steps of forming the first and second metal layers on the first major surface are unnecessary.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described referring to FIGS. 1 through 32.

(FIRST EMBODIMENT)

Figure 1:
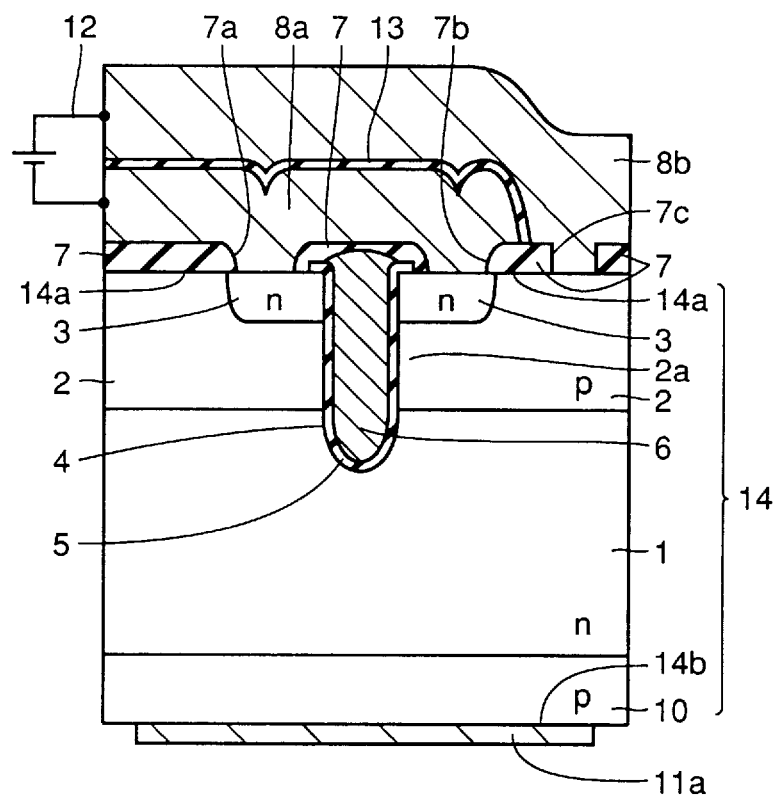
FIG. 1 is a cross section showing a semiconductor device according to the first embodiment of the invention.

With reference to FIGS. 1–7, the first embodiment of the present invention is described. FIG. 1 is a cross sectional view showing an n-channel IGBT according to the first embodiment of the invention.

Referring to FIG. 1, n-drift region 1 is formed at the side of a first major surface 14a in semiconductor substrate 14. Semiconductor substrate 14 may be an intrinsic semiconductor substrate, or constituted by a plurality of semiconductor layers. P-base region 2 is formed to extend from the first major surface 14a into n-drift region 1. Since p-base region 2 is selectively formed at the surface of n-drift region 1, some portion of n-drift region 1 may reach the first major surface 14a, but the portion is not shown for convenience. N-emitter region 3 is selectively formed to extend from the first major surface 14a into p-base region 2. P-collector region 10 is formed at the second major surface 14b of semiconductor substrate 14.

Trench 4 is formed extending from the first major surface 14a through n-emitter region 3 and p-base region 2 to n-drift region 1. The portion where p-base region 2 is adjacent to the sidewalls of trench 4 is channel formation region 2a. Gate electrode 6 is formed in trench 4 with insulated gate layer 5 interposed. Insulated gate layer 5 is formed of an insulating layer such as a silicon oxide film, and gate electrode 6 is formed of, for example, phosphorus-doped polysilicon. Insulating layer 7 is formed on the first major surface 14a to cover gate electrode 6. At insulating layer 7, contact holes 7a and 7b which expose a part of the surface of n-emitter region 3, and a contact hole 7c which exposes a part of the surface of p-base region 2 are provided.

A first metal electrode layer 8a is formed to extend from contact holes 7a and 7b onto insulating layer 7. An interlayer insulating layer 13 is provided to cover first metal electrode layer 8a. A second metal electrode layer 8b is formed to extend from contact hole 7c onto insulating layer 7 and interlayer insulating layer 13. First metal electrode layer 8a is in ohmic contact with n-emitter region 3, and second metal electrode layer 8b is in ohmic contact with p-base region 2. On the second major surface 14b, a third metal electrode layer 11a is formed in ohmic contact with p-collector region 10.

In the structure described above, a direct current power source apparatus 12 is provided such that it is electrically connected to first and second metal electrode layers 8a and 8b. The positive side of the electric current power source apparatus 12 is connected to second metal electrode layer 8b, and the negative side thereof is connected to first metal electrode layer 8a. A desired amount of potential difference is generated between n-emitter region 3 connected to first metal electrode layer 8a and p-base region 2 connected to second metal electrode layer 8b. The potential difference should be less than the built-in voltage of the pn junction between n-emitter region 3 and p-base region 2. Accordingly, on-state voltage of IGBT can be reduced without causing latch up.

Figure 2:
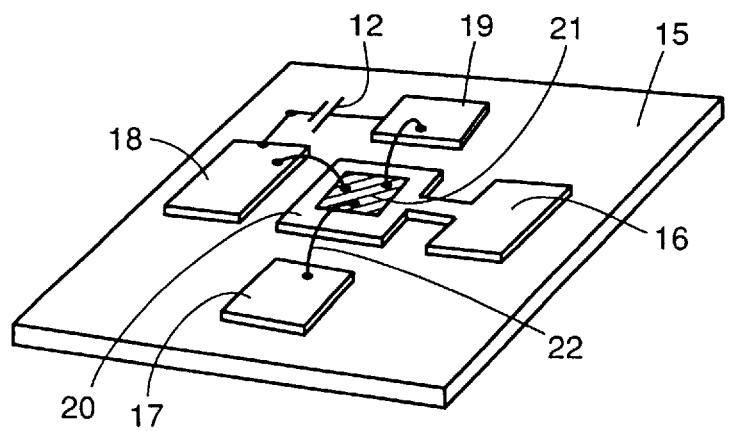
FIG. 2 is a perspective view showing one example of the method of placing a direct current power source apparatus in the first embodiment.

With reference to FIG. 2, a specific method of providing direct current power source apparatus 12 is described.

Referring to FIG. 2, metal electrode plates 16, 17, 18, 19, and 20 are placed on an insulating substrate 15 formed of ceramics or the like. Metal electrode plates 20 and 16 are electrically connected, and an IGBT 21 described above is joined onto metal electrode plate 20 with third metal electrode layer 11a facing downward. Metal electrode plate 16 is then electrically connected to p-collector layer 10 of IGBT 21. Metal electrode plate 17 is electrically connected to gate electrode 6 of IGBT 21 by a bonding wire 22. Metal electrode plate 18 is electrically connected to first metal electrode layer 8a by a bonding wire 22. Metal electrode plate 19 is connected to second metal electrode layer 8b by bonding wire 22. Direct current power source apparatus 12 is placed on insulating substrate 15 such that it is electrically connected to metal electrode plates 18 and 19.

Next with reference to FIGS. 3–7, a method of manufacturing the n-channel IGBT shown in FIG. 1 will be described.

Figure 3:
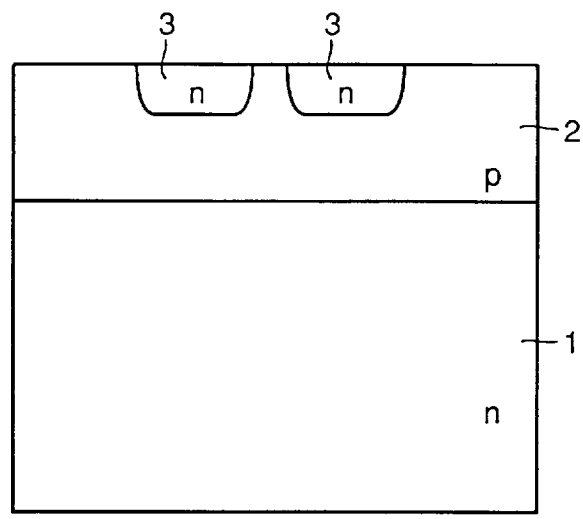
FIGS. 3–7 are cross sections respectively showing the first through the fifth steps of the method of manufacturing the semiconductor apparatus in the first embodiment.
Figure 4:
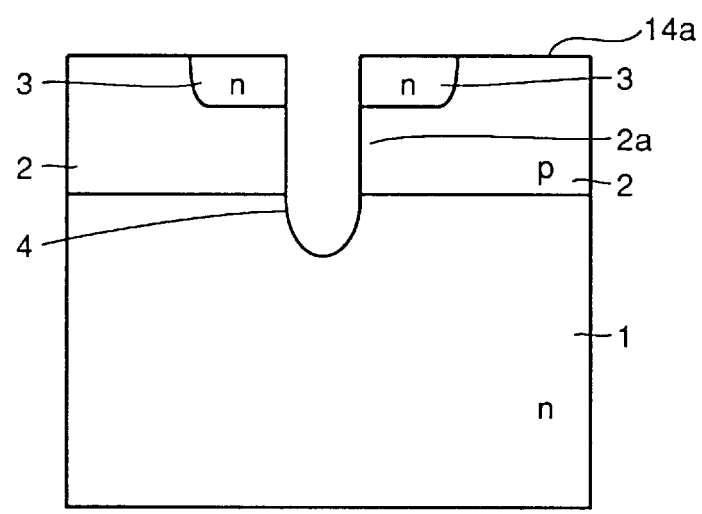

Referring to FIG. 3 first, p-base region 2 and n-emitter region 3 are formed in n-drift region 1 by the ion implantation and the thermal diffusion. As shown in FIG. 4, trench 4 is formed to penetrate through n-emitter region 3 and p-base region 2 by the anisotropic etching of first major surface 14a. The width of trench 4 is approximately 1.0 μm, and the depth thereof is approximately 10.0 μm.

Figure 5:
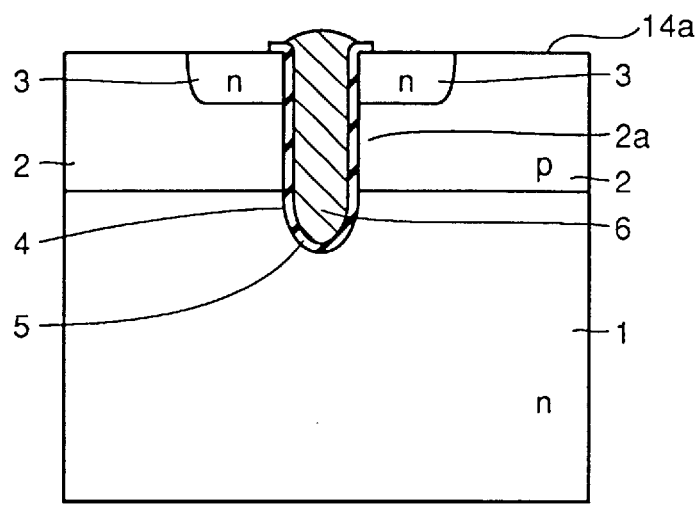
Figure 6:
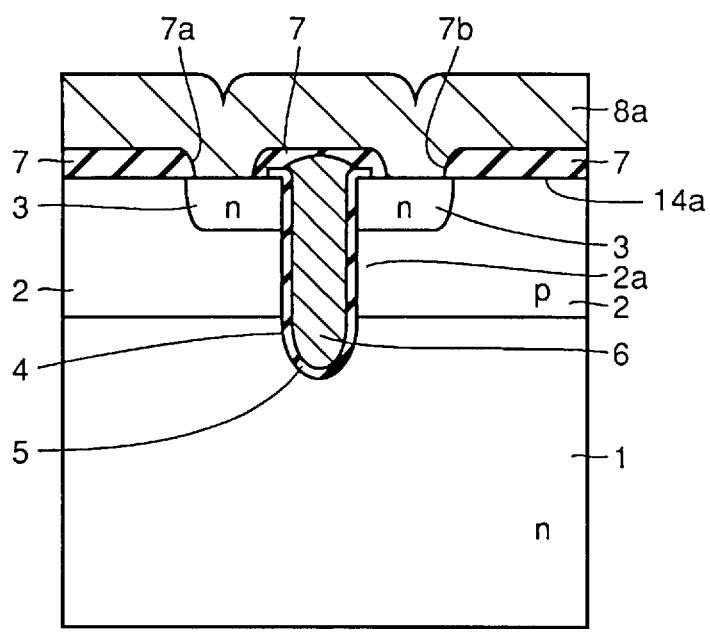

Next with reference to FIG. 5, the inner surface of trench 4 and the first major surface 14a undergo thermal oxidation. A silicon oxide film is thus formed on the inner surface of trench 4 and the first major surface 14a. A phosphorus-doped polysilicon layer is deposited to fill trench 4 using CVD (Chemical Vapor Deposition) method. The phosphorus-doped polysilicon layer is patterned to provide gate electrode 6. Preferably, gate electrode 6 is formed to project from trench 4. Insulated gate layer 5 is formed by the patterning of the silicon oxide film.

Insulating layer 7 is formed on the first major surface 14a to cover gate electrode 6 by the CVD method or the like. Insulating layer 7 is etched to provide contact holes 7a and 7b which partially expose n-emitter region 3. At this time, an opening may be provided at insulating layer 7 for forming a conductive layer (not shown) electrically connected to gate electrode 6. First metal electrode layer 8a is formed to extend from contact holes 7a and 7b onto insulating layer 7.

Figure 7:
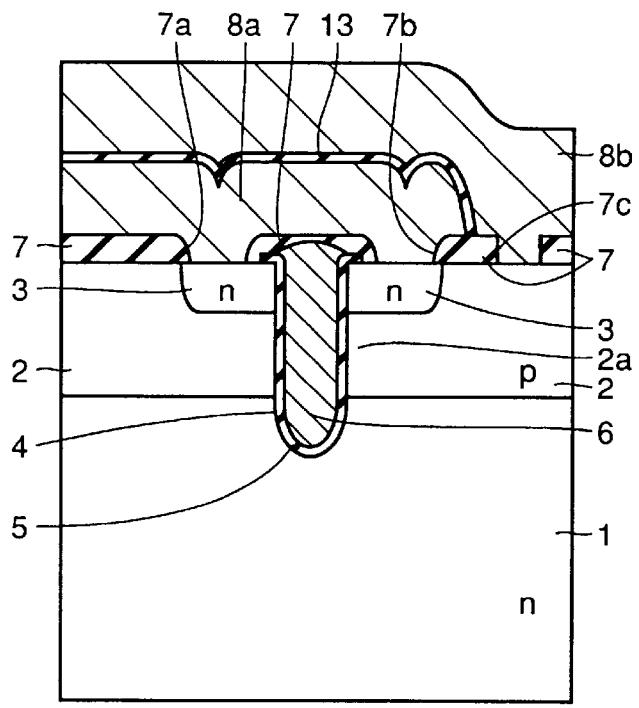

Next with reference to FIG. 7, first metal electrode layer 8a is patterned to a prescribed shape, and on the entire surface interlayer insulating layer 13 is formed by CVD or the like. Interlayer insulating layer 13 is patterned to a prescribed shape, and insulating layer 7 located on p-base region 2 is etched. Contact hole 7c is thus provided. Second metal electrode layer 8b is formed to extend from contact hole 7c onto interlayer insulating layer 13.

P-collector region 10 is thereafter formed in semiconductor substrate 14 at the second major surface 14b, and third metal electrode layer 11a is formed on the second major surface 14b in ohmic contact with p-collector region 10. Direct current power source apparatus 12 electrically connected to first and second metal electrode layers 8a and 8b is provided. IGBT shown in FIG. 1 is accordingly provided through the process steps described above.

(SECOND EMBODIMENT)

Figure 8:
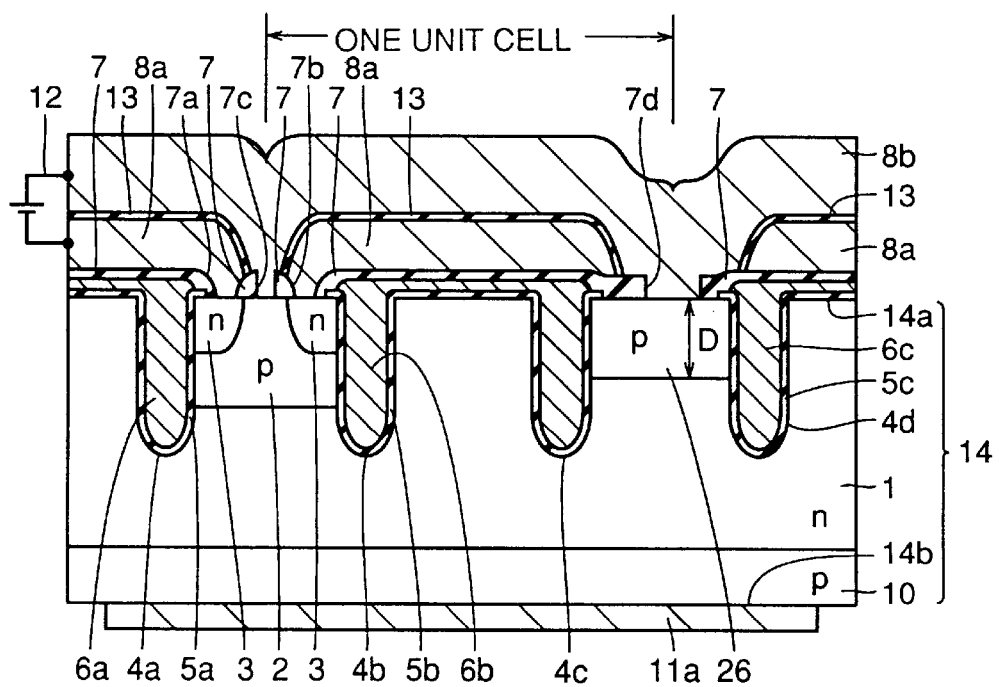
FIG. 8 is a cross sectional view showing a semiconductor device according to the second embodiment.

Next referring to FIGS. 8–17, the second embodiment of the present invention is described. FIG. 8 shows a cross section of an n-channel IGBT according to the second embodiment of the invention.

With reference to FIG. 8, trenches 4a, 4b, 4c, and 4d are formed with respective spaces inbetween. A gate electrode 6a is formed in trench 4a with an insulated gate layer 5a interposed. A gate electrode 6b is formed to extend from trench 4b via the first major surface 14a into trench 4c with an insulated gate layer 5b interposed. In trench 4d, a gate electrode 6c is formed with an insulated gate layer 5c interposed. P-base region 2 is provided between trenches 4a and 4b, and n-emitter regions 3 are formed at the surface of p-base region 2 with a space inbetween.

N-drift region 1 is extended between trenches 4b and 4c, and hole draw out region 26 of p type in ohmic contact with second metal electrode layer 8b is provided between trenches 4c and 4d. Hole draw out region 26 provides a region where holes can be drawn out therethrough during the switching operation of IGBT from ON state to OFF state. Holes can be efficiently drawn out during the switching operation through hole draw out region 26. Power loss during the switching operation can thus be reduced. It is noted that direct current power source apparatus 12 prevents on-state voltage from rising even if there is provided the hole draw out region 26. The peak concentration of the impurities of p type contained in hole draw out region 26 is preferably not less than $1 \times 10^{16}$ cm$^{-3}$ and not more than $5 \times 10^{21}$ cm$^{-3}$. The depth D of hole draw out region 26 is made smaller than those of trenches 4a–4d.

As shown in FIG. 8, gate electrode 6b is provided to extend into both trenches 4b and 4c, so that electrons can be supplied from the region between trenches 4b and 4c during ON operation. Accordingly, on-state voltage can further be reduced compared with the first embodiment. It is noted that the latch up can be prevented in this embodiment as the first embodiment.

Next with reference to FIGS. 9–16, a method of manufacturing the IGBT shown in FIG. 8 is described. FIGS. 9–16 are cross sectional views illustrating the first through the eighth steps of the process of manufacturing the IGBT in FIG. 8.

Figure 9:
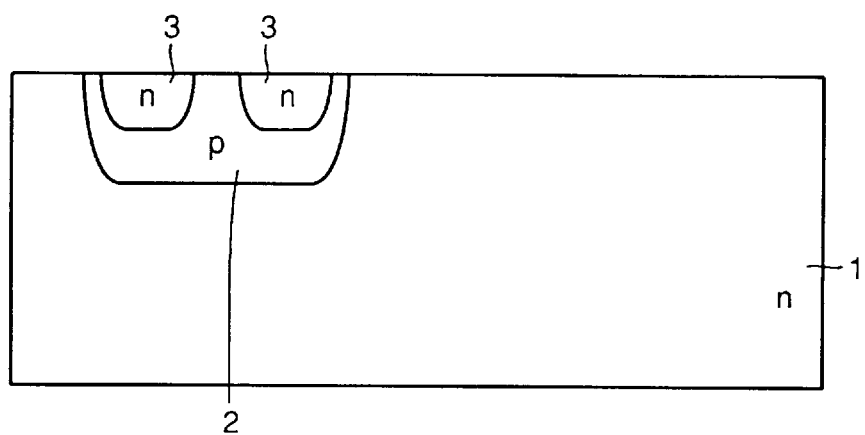
FIGS. 9–16 are cross sections respectively showing the first through the eighth steps of the process of manufacturing a semiconductor device in the second embodiment.
Figure 10:
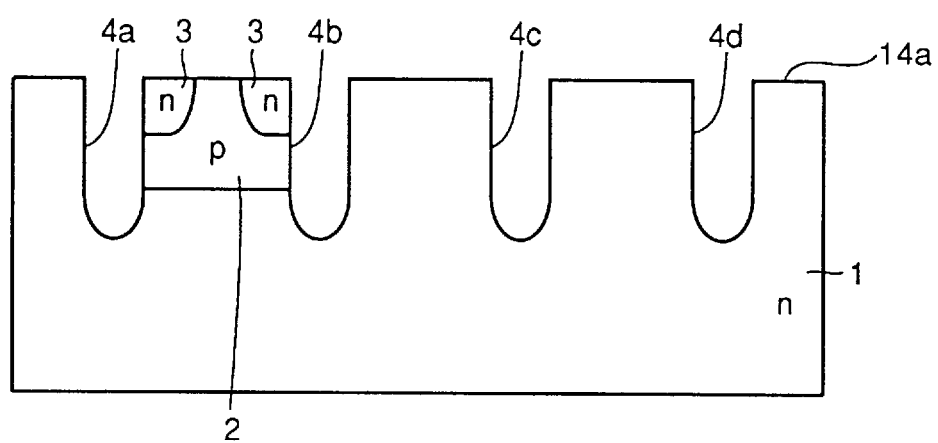

First with reference to FIG. 9, p-base region 2 and n-emitter regions 3 are selectively formed at the surface of n-drift region 1 by the ion implantation and the thermal diffusion method. As shown in FIG. 10, the first major surface 14a is anisotropically etched to produce trenches 4a, 4b, 4c and 4d.

Figure 11:
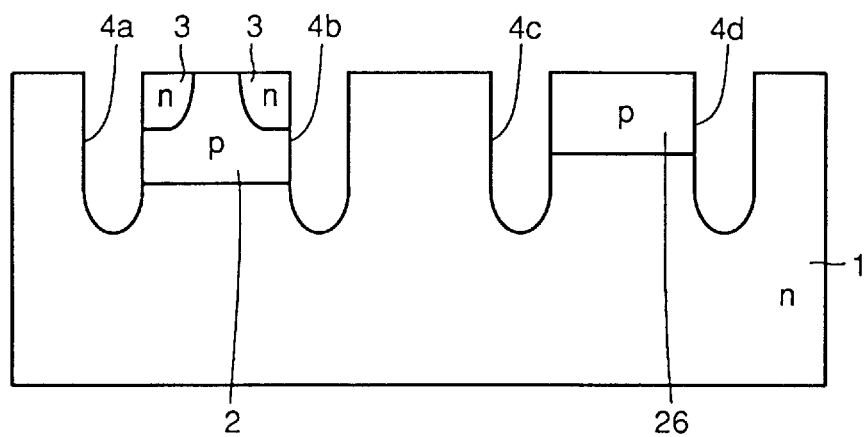
Figure 12:
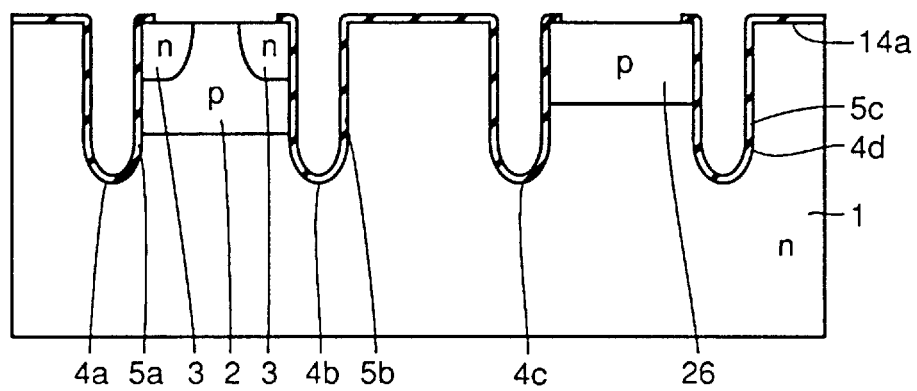
Figure 13:
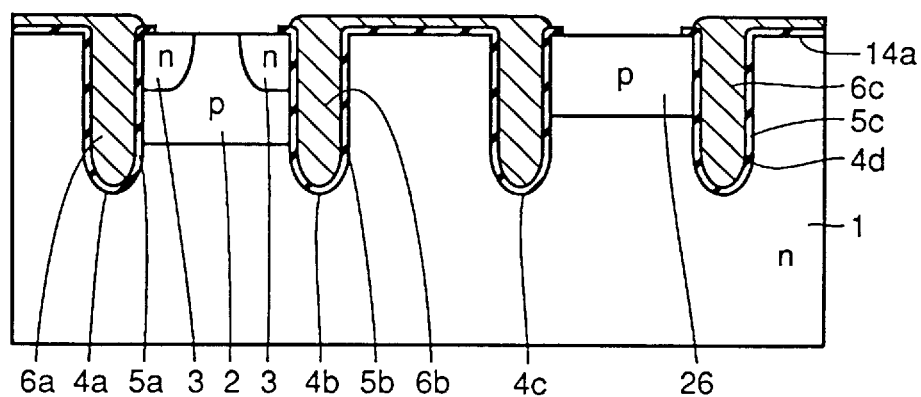
Figure 14:
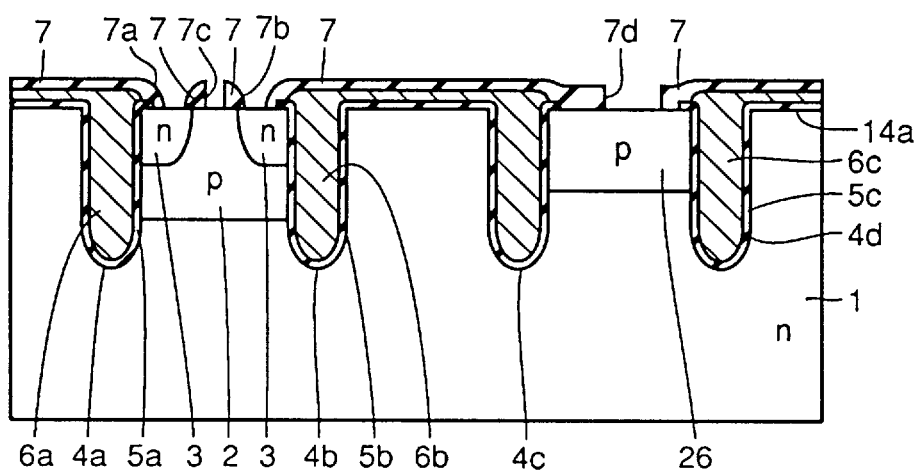

Referring to FIG. 11 next, hole draw out region 26 of p type is formed at the surface of n-drift region 1 located between trenches 4c and 4d by the ion implantation and the thermal diffusion. As shown in FIG. 12, the inner surfaces of trenches 4a–4d and the first major surface 14a undergo the thermal oxidation process to generate a silicon oxide film, and the silicon oxide film is patterned to a prescribed shape. Insulated gate layers 5a, 5b, and 5c are then respectively formed. A phosphorus-doped polysilicon layer is deposited on the first major surface 14a to fill trenches 4a–4d by CVD method. The polysilicon layer is patterned to a prescribed shape to provide gate electrodes 6a, 6b and 6c.

Figure 15:
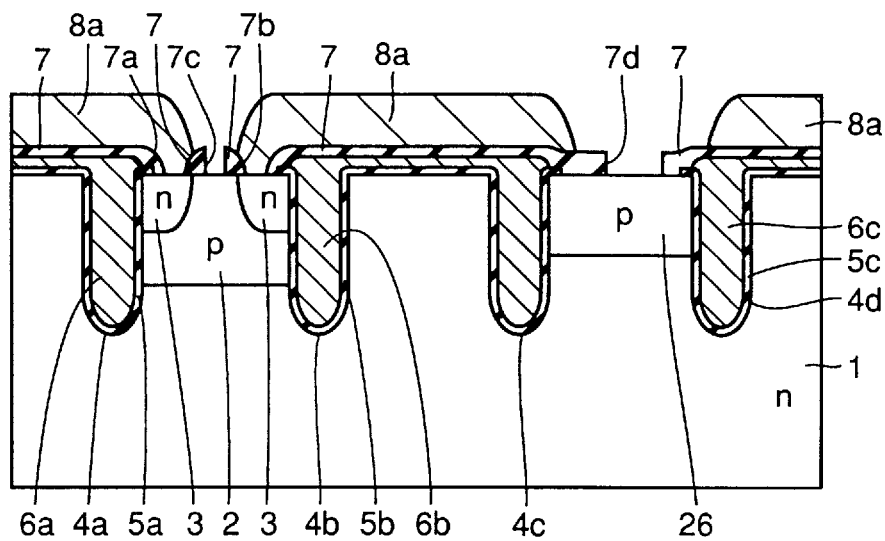
Figure 16:
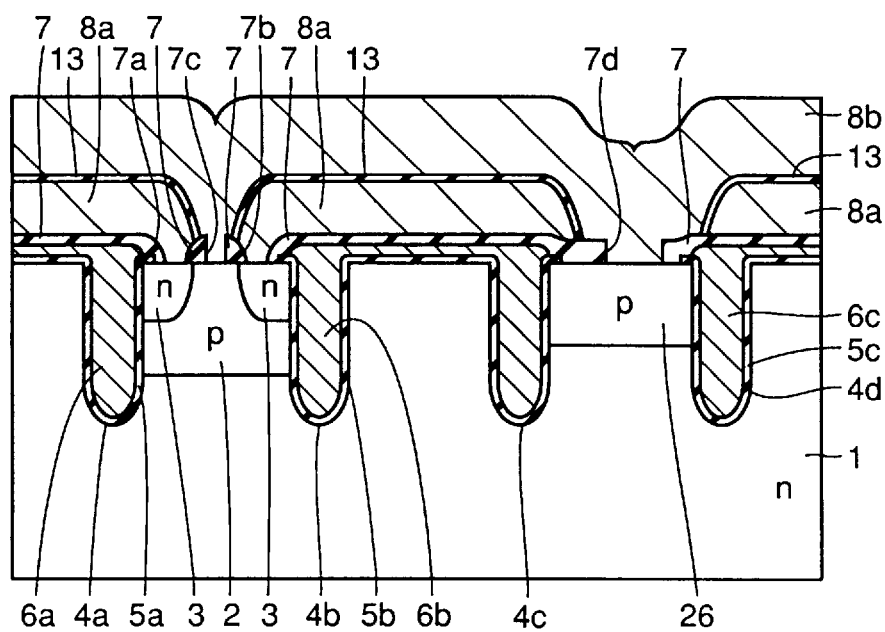

Insulating layer 7 is next formed on the first major surface 14a to cover gate electrodes 6a–6c. Insulating layer 7 is etched to produce contact holes 7a, 7b, 7c and 7d. A metal layer is deposited on the entire surface, then patterned to a prescribed shape. First metal electrode layer 8a is thus provided to extend from contact holes 7a, 7b onto insulating layer 7 as shown in FIG. 15.

Interlayer insulating layer 13 is formed to cover first metal electrode layer 8a, then a metal layer is deposited on interlayer insulating layer 13. The metal layer is patterned to a prescribed shape to provide second metal electrode layer 8b. Second metal electrode layer 8b is in ohmic contact with p-base region 2 as well as hole draw out region 26. Through the steps similar to those of the first embodiment, the IGBT shown in FIG. 8 is completed.

Figure 17:
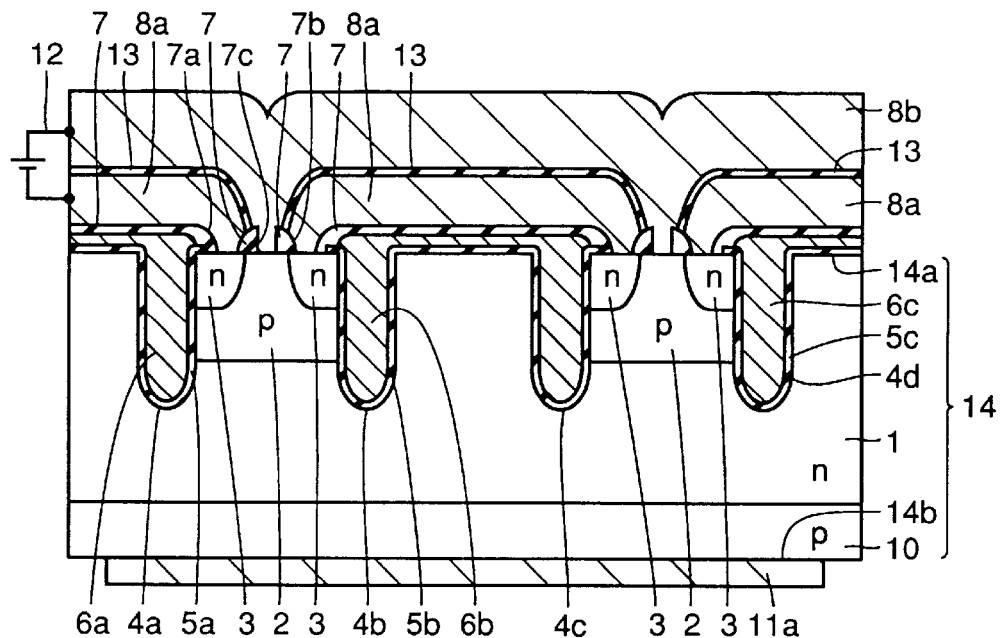
FIG. 17 is a cross sectional view showing a semiconductor device in accordance with the modification of the second embodiment.

Next with reference to FIG. 17, a modification of IGBT in the second embodiment shown in FIG. 8 is described. FIG. 17 is a cross section showing IGBT in the modification of IGBT according to the second embodiment.

Referring to FIG. 17, different from IGBT in FIG. 8, p-base region 2 and n-emitter region 3 are formed where hole draw out region 26 is provided in IGBT of FIG. 8. The other structure is almost similar to that of IGBT in FIG. 8.

On-state voltage can further be reduced compared with the second embodiment shown in FIG. 8, since p-base region 2 and n-emitter region 3 are provided where hole draw out region 26 is formed. It is noted that the principle of this modification can be applied to IGBT according to the fourth and the sixth embodiments hereinafter described. Similar effects are obtainable also in those embodiments.

(THIRD EMBODIMENT)

Figure 18:
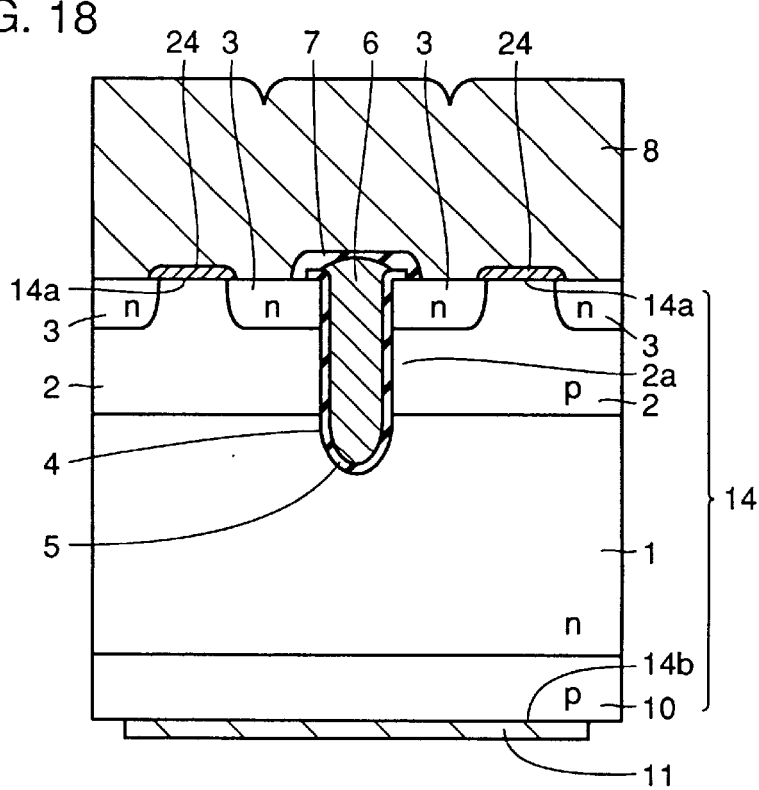
FIG. 18 is a cross section showing a semiconductor device according to the third embodiment of the invention.

Next with reference to FIGS. 18–21, the third embodiment of the present invention is described. FIG. 18 is a cross section showing an IGBT according to the third embodiment.

Referring to FIG. 18, a resistive layer 24 is formed on the surface of p-base region 2 in the third embodiment. Resistive layer 24 is constituted, for example, by non-doped polysilicon or polysilicon doped with phosphorus of low concentration. The resistance of resistive layer 24 is preferably higher than the sheet resistance of p-base region 2. Metal electrode layer 8 is formed on the first major surface 14a to cover resistive layer 24. Metal electrode layer 8 is in ohmic contact with n-emitter region 3 and electrically connected to p-base region 2 with resistive layer 24 interposed. The other structure is almost similar to that shown in the first embodiment.

Resistive layer 24 makes the potential of p-base region 2 higher than that of n-emitter region 3 during ON operation of IGBT. Accordingly, forward bias can be applied to the pn junction between p-base region 2 and n-emitter region 3. On-state voltage of IGBT can thus be reduced as the case shown in the first embodiment.

Specifically, when current having its density of 100 A/cm$^2$ flows in the cell of 5 $\mu$m×5 $\mu$m, for example, on-state voltage can be reduced by up to approximately 0.17 V by setting the resistance of resistive layer 24 approximately $2\times10^3$ ($\Omega$)–$2\times10^5$ ($\Omega$). Preferably, the amount of the voltage drop caused by resistive layer 24 is lower than the built-in voltage of the pn junction between p-base region 2 and n-emitter region 3. The latch up can thus be prevented.

Figure 19:
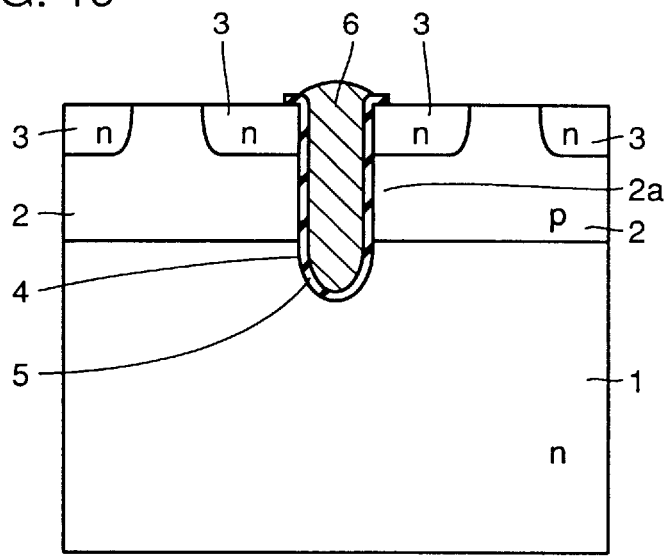
FIGS. 19–21 are cross sections respectively showing the first through the third steps of the process of manufacturing a semiconductor device according to the third embodiment.
Figure 20:
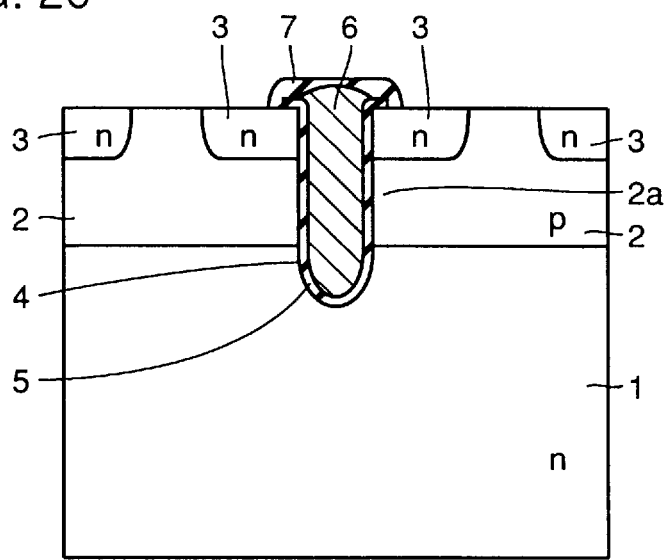
Figure 21:
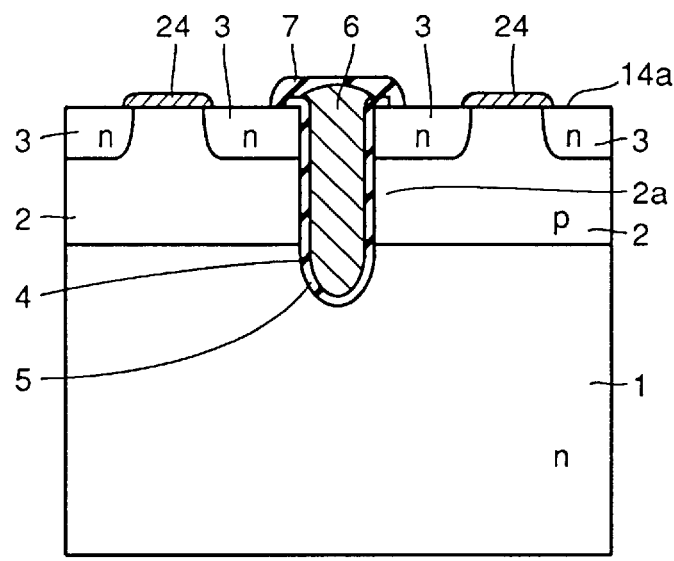

Next with reference to FIGS. 19–21, a method of manufacturing IGBT according to the third embodiment is described. FIGS. 19–21 are cross sections respectively showing the first through the third steps of the characteristic process of manufacturing IGBT according to the third embodiment.

Referring to FIG. 19 first, the structure is completed up to gate electrode 6 through the steps similar to those in the first embodiment. Next, insulating layer 7 is formed through the same method as that of the first embodiment, and insulating layer 7 is patterned to a prescribed shape. At this time, insulating layer 7 is patterned to expose the entire surface of p-base region 2 located between n-emitter regions 3.

A phosphorus-doped polysilicon layer is deposited on the first major surface 14a by CVD method or the like, and the polysilicon layer is patterned to a prescribed shape. As shown in FIG. 21, resistive layer 24 is provided to extend from the surface of p-base region 2 onto a part of the surface of n-emitter region 3.

Metal electrode layer 8 is formed to cover resistive layer 24 and n-emitter region 3. Through the steps similar to those in the first embodiment, IGBT shown in FIG. 18 is completed.

(FOURTH EMBODIMENT)

Figure 22:
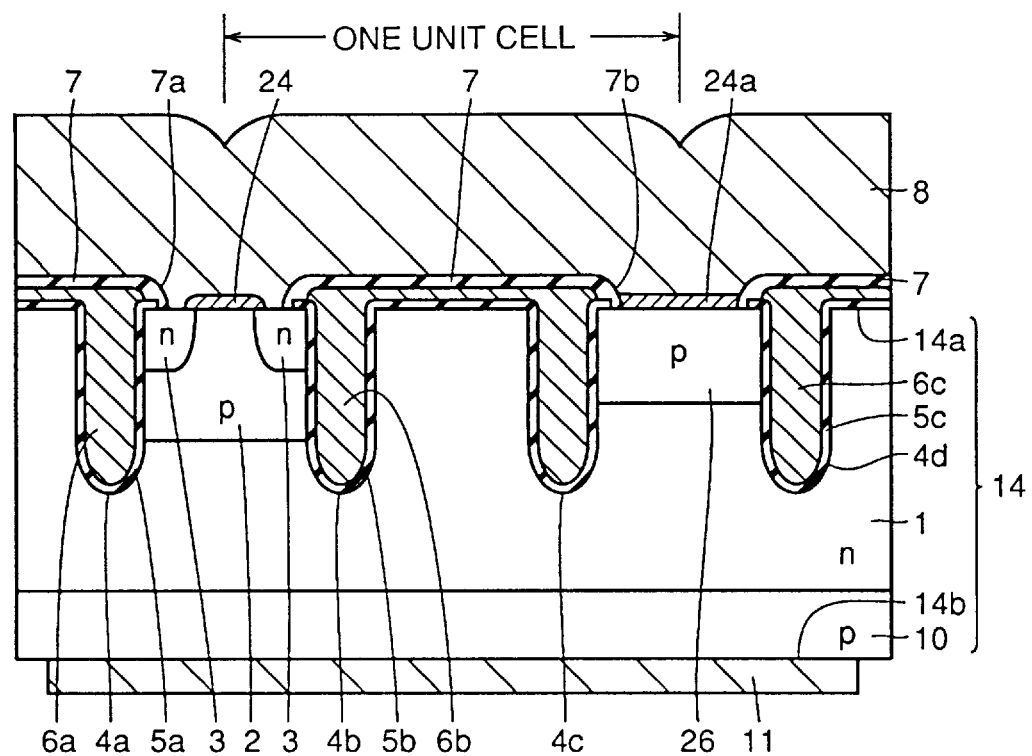
FIG. 22 is a cross section showing a semiconductor device according to the fourth embodiment of the invention.

Next with reference to FIGS. 22–25, the fourth embodiment of the present invention is described. FIG. 22 is a cross sectional view illustrating IGBT in the fourth embodiment.

Referring to FIG. 22, the principles of the second and third embodiments described above are applied to IGBT according to the fourth embodiment. Specifically, trenches 4a, 4b, 4c, and 4d are respectively formed with spaces inbetween, and insulated gate layer 5b and gate electrode 6b are provided to extend from trench 4b into trench 4c. P-base region 2 is formed between trenches 4a and 4b, and hole draw out region 26 is provided between trenches 4c and 4d. Resistive layer 24 is deposited on the surface of p-base region 2, and a resistive layer 24a is also formed on the surface of hole draw out region 26. Metal electrode layer 8 is provided to cover resistive layers 24 and 24a and n-emitter region 3. The other structure is almost the same as that according to the second embodiment. It is noted that resistive layer 24a may or may not be provided.

On-state voltage of IGBT can be reduced by providing resistive layer 24 as the case of the third embodiment. Hole draw out region 26 makes it possible to reduce the power loss during the switching operation. As the second embodiment, on-state voltage can further be reduced since gate electrode 6b extends from trench 4b into trench 4c.

Figure 23:
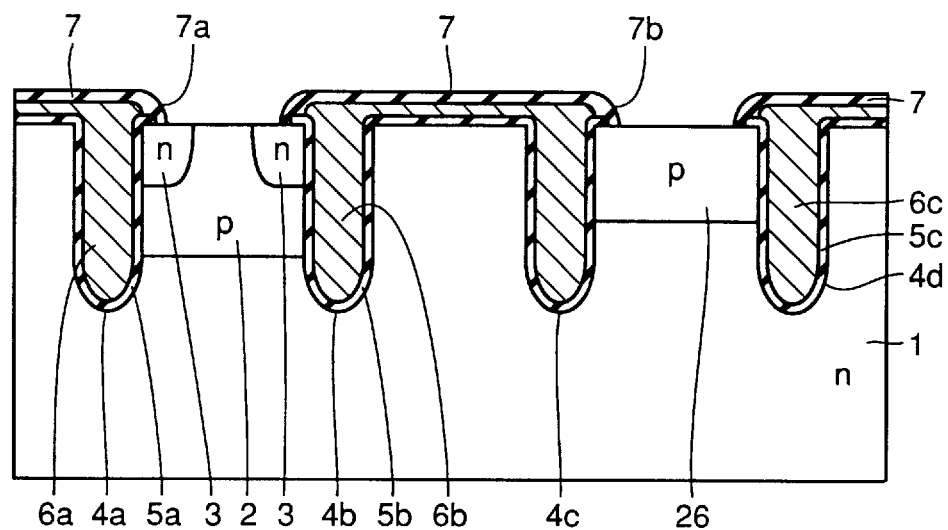
FIGS. 23–25 are cross sections respectively showing the first through the third steps of the process of manufacturing a semiconductor device according to the fourth embodiment.
Figure 24:
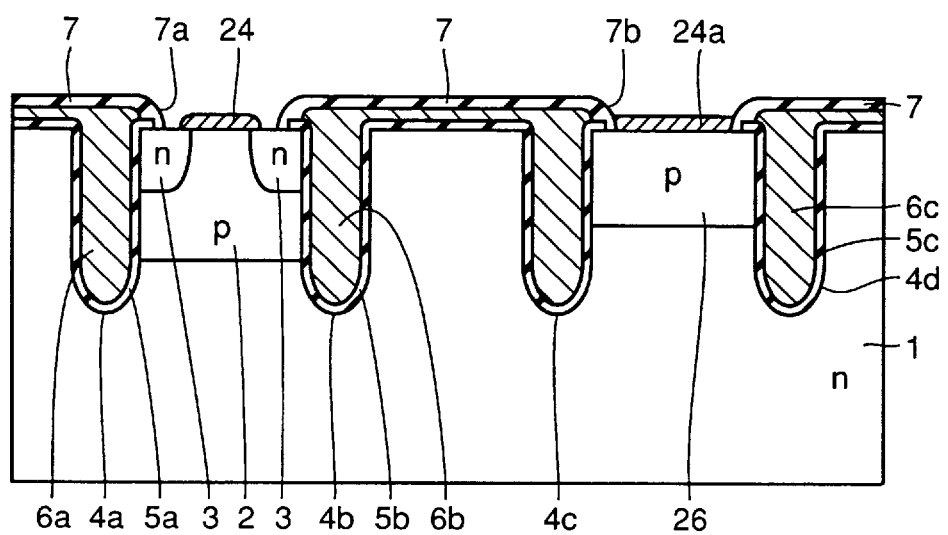
Figure 25:
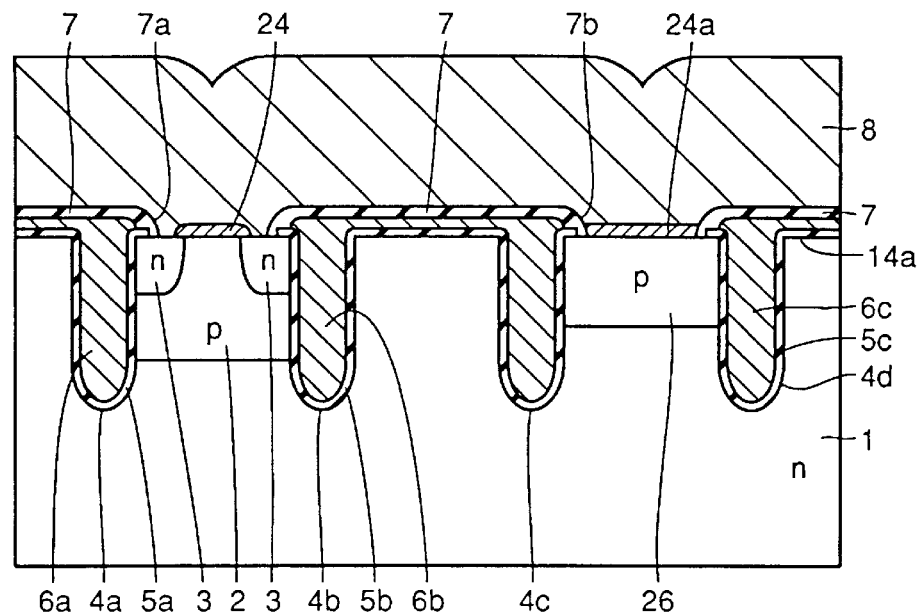

Next with reference to FIGS. 23–25, a method of manufacturing IGBT according to the fourth embodiment is described.

Referring to FIG. 23 first, the structure is completed up to gate electrodes 6a, 6b and 6c through the steps similar to those of the second embodiment. Insulating layer 7 is formed to cover gate electrodes 6a, 6b and 6c, and insulating layer 7 is patterned. Contact hole 7a which exposes the surface of p-base region 2 and a part of the surface of n-emitter region 3, and contact hole 7b which partially exposes the surface of hole draw out region 26 are respectively provided.

As shown in FIG. 24, a phosphorus-doped polysilicon layer is deposited on the entire surface through CVD method or the like, then the polysilicon layer is patterned to a prescribed shape. Resistive layer 24 is thus provided to extend from the surface of p-base region 2 onto a part of the surface of n-emitter region 3, and resistive layer 24a is also provided on a part of the surface of hole draw out region 26.

Next, with reference to FIG. 25, metal electrode layer 8 is formed on the first major surface 14a to cover resistive layers 24 and 24a. IGBT shown in FIG. 22 is completed through the steps similar to those shown in the second embodiment.

(FIFTH EMBODIMENT)

Figure 26:
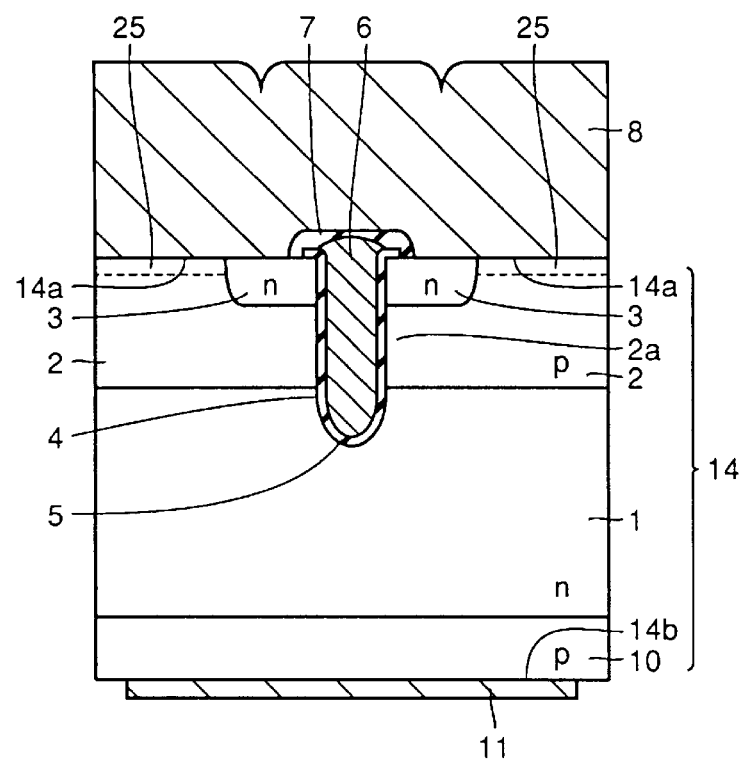
FIG. 26 is a cross section showing a semiconductor device according to the fifth embodiment of the invention.
Figure 27:
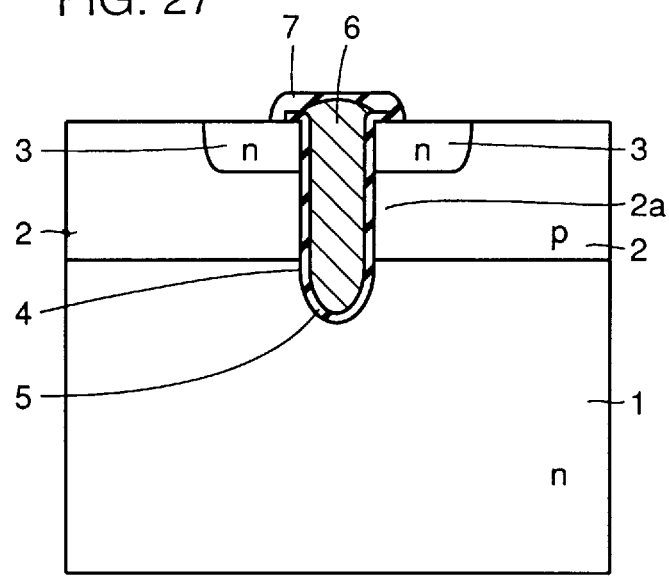
FIGS. 27 and 28 are cross sections respectively showing the first and the second steps of the process of manufacturing a semiconductor device according to the fifth embodiment.
Figure 28:
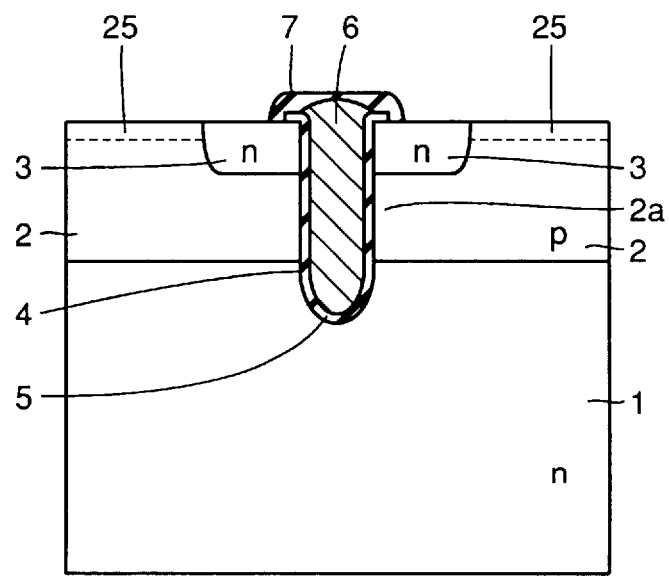

Referring to FIGS. 26–28, the fifth embodiment is described. FIG. 26 is a cross section showing IGBT according to the fifth embodiment.

Referring to FIG. 26, a Schottky junction region 25 is formed at the surface of p-base region 2 according to this embodiment. Schottky junction region 25 can be formed, for example, by maintaining the concentration of impurities existing in the region where p-base region 2 is in contact with metal electrode layer 8 at low level. N-emitter region 3 contains n type impurities of high concentration (e.g. at least $10^{19}$ cm$^{-3}$), allowing ohmic contact with metal electrode layer 8. The low concentration of p type impurities in the contact portion between p-base region 2 and metal electrode layer 8 produces an energy barrier where metal electrode layer 8 is in contact with p-base region 2. Accordingly, Schottky junction can be provided between p-base region 2 and metal electrode layer 8.

Metal electrode layer 8 may be formed of material of which height of the energy barrier generated for n type impurity region is sufficiently lower than that for p type impurity region. By using such material, the height of the energy barrier between p-base region 2 and metal electrode layer 8 can be made higher than that between metal electrode layer 8 and n-emitter region 3, thereby providing Schottky junction region 25 as shown above.

The material of the electrode used for n-emitter region 3 may be different from that used for p-base region 2. Specifically, first metal electrode layer 8a and second metal electrode layer 8b are provided as shown in FIG. 1, using different kinds of material for the first and the second metal electrode layers 8a and 8b. In this case, as material for first metal electrode layer 8a, the material of which height of the energy barrier generated for n-emitter region 3 is as low as possible is selected. As the material for second metal electrode layer 8b, the material of which height of the energy barrier generated for p-base region 2 is higher than that of first metal electrode layer 8a is employed. Schottky junction region 25 can thus be provided. It is noted that the principles described above can be appropriately combined.

Schottky junction region 25 causes voltage drop in itself as the case according to the third embodiment, and on-state voltage of IGBT can be reduced. According to the fifth embodiment, the potential difference between p-base region 2 and n-emitter region 3 caused by Schottky junction region 25 is smaller than the built-in voltage of the pn junction between p-base region 2 and n-emitter region 3 as described in the third embodiment. The latch up can be prevented accordingly.

Next, with reference to FIGS. 27 and 28, the manufacturing method according to the fifth embodiment is described. FIGS. 27 and 28 are cross sectional views illustrating the first and the second steps of the manufacturing process of IGBT according to the fifth embodiment.

Referring to FIG. 27, the structure is completed up to insulating layer 7 through the steps similar to those shown in the third embodiment. As illustrated in FIG. 28, Schottky junction region 25 is provided at the surface of p-base region 2. Schottky junction region 25 can be formed, for example, by controlling the concentration of p type impurities at the surface of p-base region 2 to maintain the lower concentration of p type impurities contained at the surface of p-base region. Specifically, the amount of p type impurities doped for the contact with metal electrode layer 8 may be controlled or doping may be omitted.

IGBT shown in FIG. 26 is thereafter completed through the steps similar to those according to the third embodiment.

(SIXTH EMBODIMENT)

Figure 29:
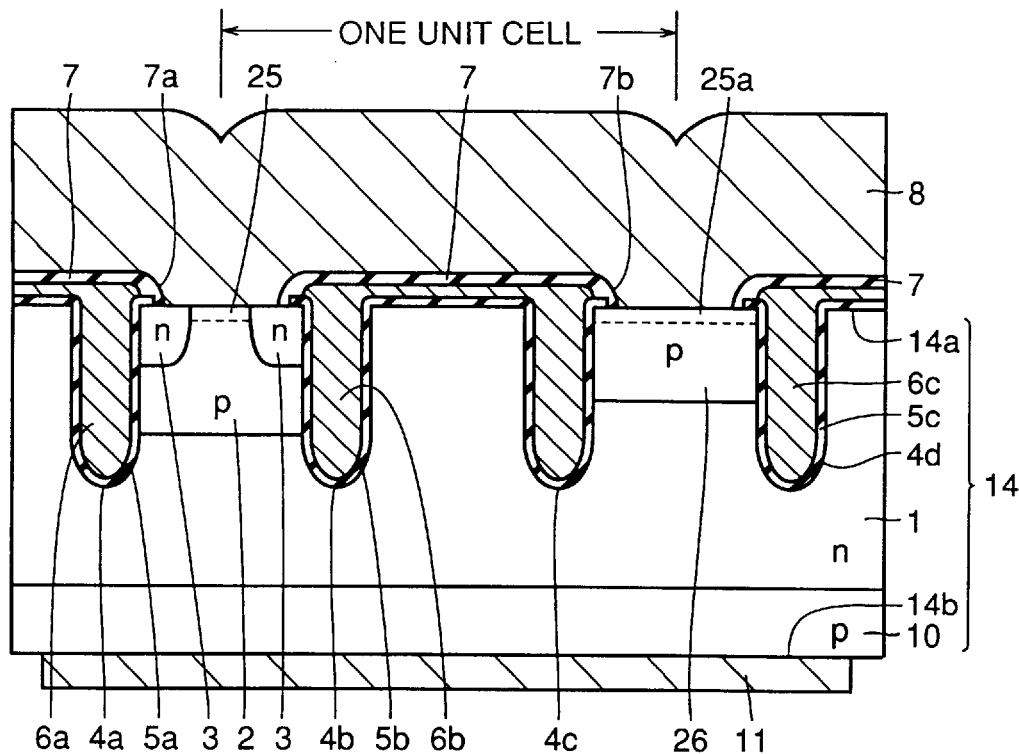
FIG. 29 is a cross sectional view showing a semiconductor device according to the sixth embodiment of the invention.

Next with reference to FIGS. 29–32, the sixth embodiment of the present invention is described. FIG. 29 is a cross section illustrating an IGBT according to the sixth embodiment.

Referring to FIG. 29, different from IGBT according to the fourth embodiment, Schottky junction region 25 is formed at the surface of p-base region 2, and Schottky junction region 25a is also formed at the surface of hole draw out region 26. The other structure is almost similar to that shown in the fourth embodiment. The effect similar to that of the fourth embodiment can be obtained accordingly. It is noted that Schottky junction region 25a may or may not be provided.

Figure 30:
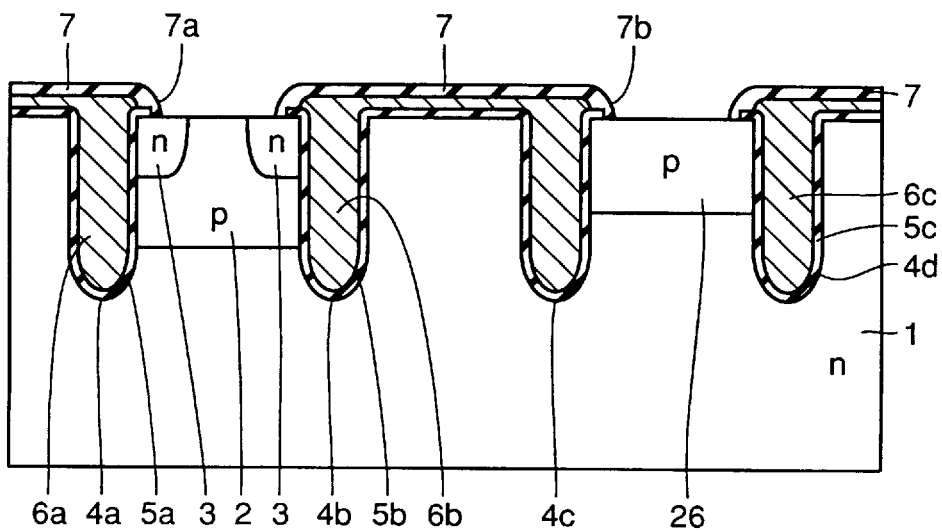
FIGS. 30–32 are cross sections respectively showing the first through the third process steps of manufacturing a semiconductor device according to the sixth embodiment.
Figure 31:
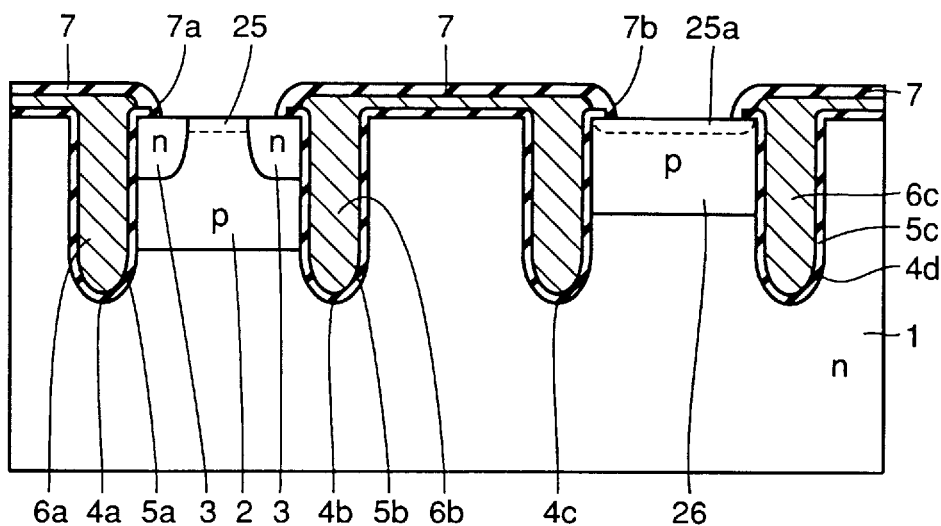
Figure 32:
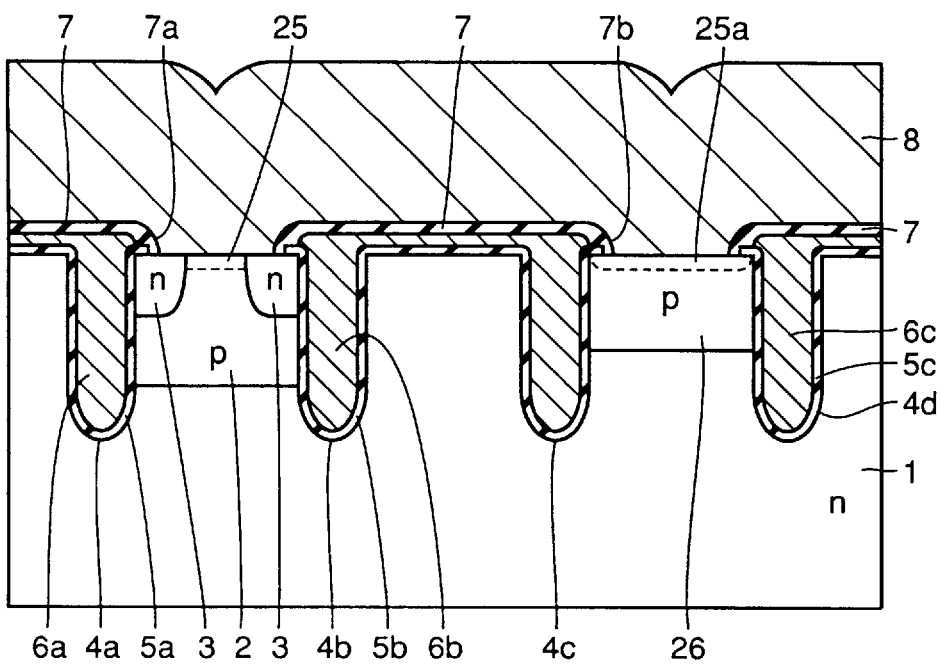
Figure 33:
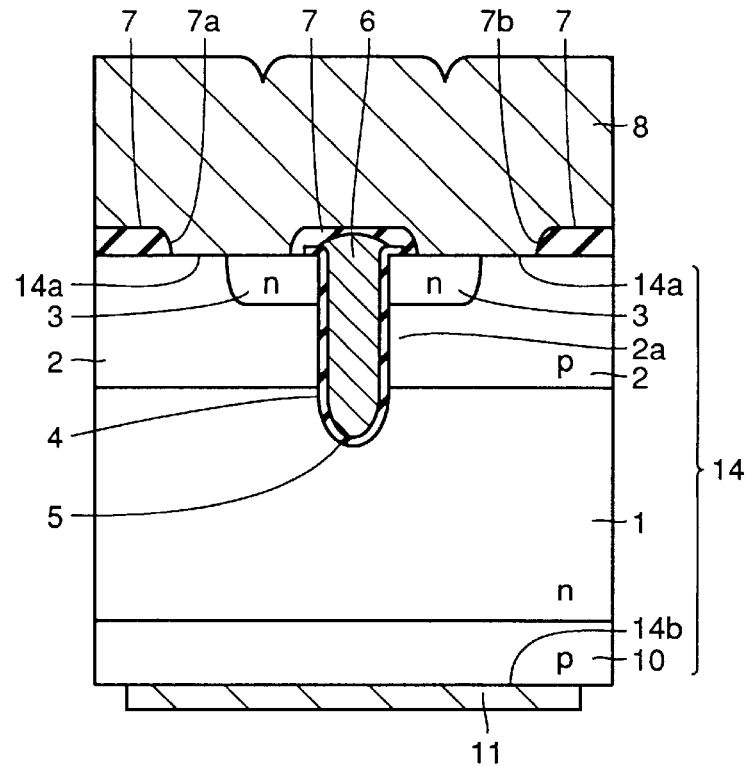
FIG. 33 is a cross section showing one example of a conventional semiconductor device.
Figure 34:
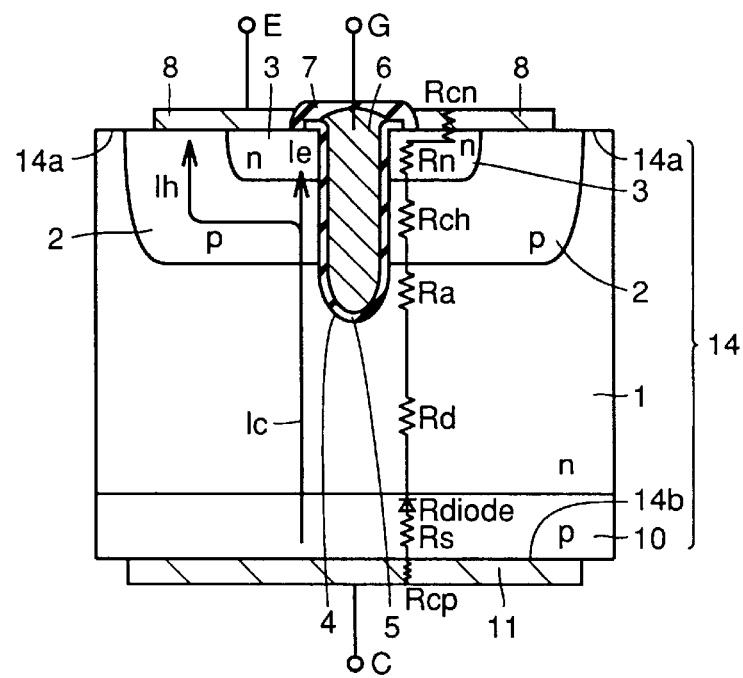
FIG. 34 shows the electric current path in the semiconductor device shown in FIG. 33.
Figure 35:
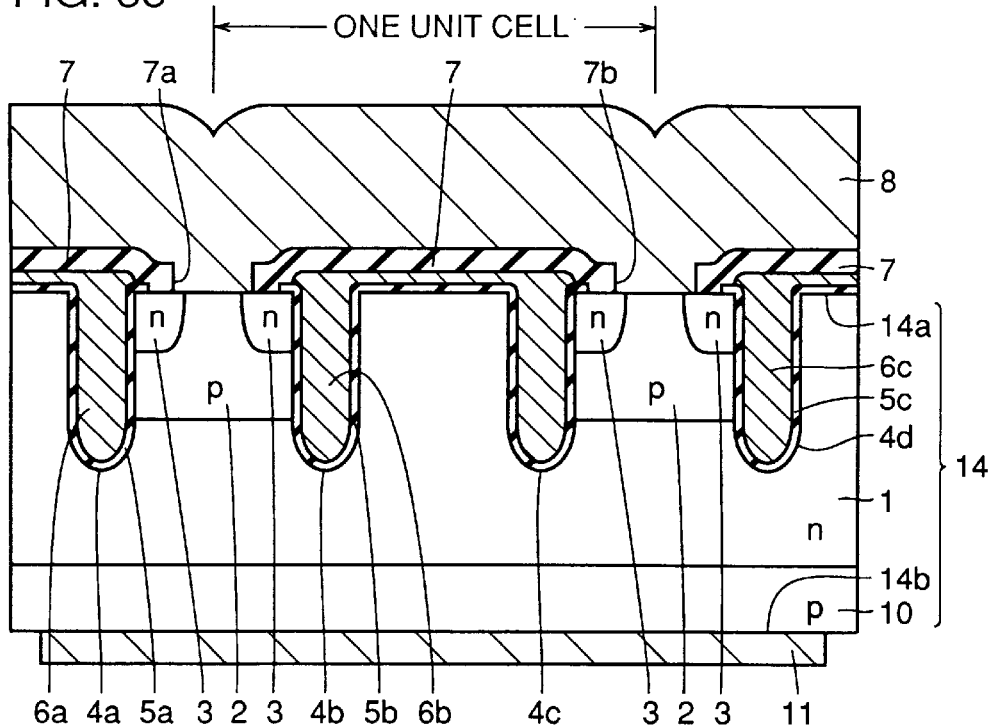
FIG. 35 is a cross section showing a semiconductor device in accordance with the first conventional improved modification.
Figure 36:
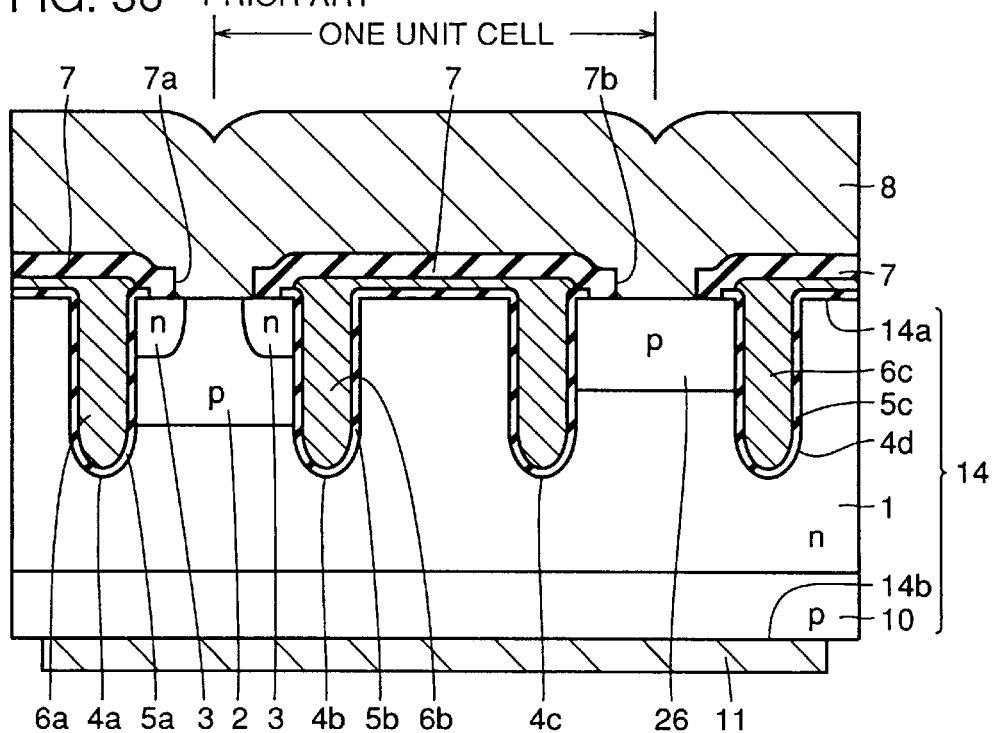
FIG. 36 is a cross section showing a semiconductor device according to the second conventional improved modification.
Figure 37:
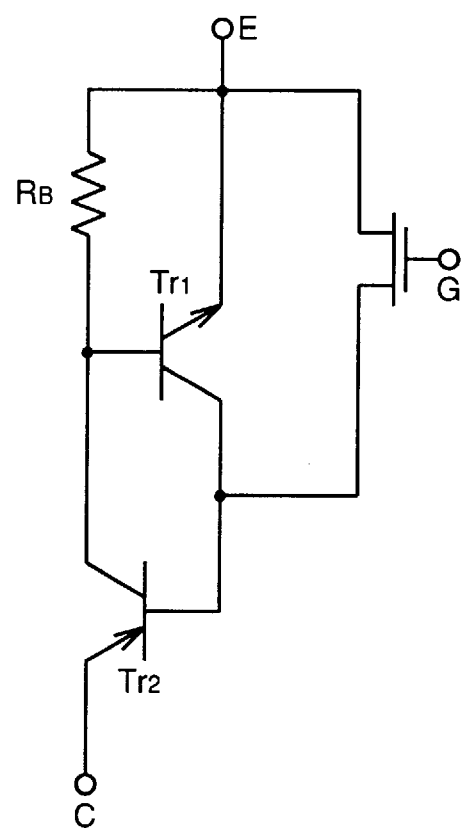
FIG. 37 is an equivalent circuit of a semiconductor device showing latch up phenomenon.

Next with reference to FIGS. 30–32, a method of manufacturing IGBT according to the sixth embodiment is described. FIGS. 30–32 are cross sections respectively showing the first through the third steps of manufacturing IGBT according to the sixth embodiment.

Referring to FIG. 30, the structure up to contact holes 7a and 7b is provided through the steps similar to those according to the fourth embodiment. With reference to FIG. 31, Schottky junction regions 25 and 25a are respectively formed at the surfaces of p-base region 2 and hole draw out region 26. These regions are formed following the same method as that according to the fifth embodiment. As shown in FIG. 32, metal electrode layer 8 is formed to cover Schottky junction regions 25 and 25a. IGBT shown in FIG. 29 is completed through the steps similar to those according to the fourth embodiment.

In each embodiment shown above, the description is given for the case in which the present invention is applied to an n-channel IGBT. However, the invention is also applicable to a P channel IGBT. Although the diagram is not given herein, the characteristics of respective embodiments can be combined.

According to one aspect of the present invention described above, forward bias means is provided in the semiconductor device so that forward bias can be applied to the pn junction between the second and the third impurity regions during conduction (ON state). Electrons can be injected easily from the third impurity region to the second impurity region during conduction, thereby reducing on-state voltage of the semiconductor device. At this time, the voltage applied by the forward bias means to the pn junction between the second and the third impurity regions is preferably smaller than the built-in voltage of the pn junction between the second and the third impurity regions. Latch up can thus be effectively prevented.

In the semiconductor device according to another aspect of the invention, the second impurity region is formed between the first and the second trenches, and the third trench is provided spaced apart from the second trench. A gate electrode is formed to extend from the second trench into the third trench. Electrons can be also supplied from the surface of the first impurity region located between the second and the third trenches during conduction. On-state voltage can further be reduced compared with one aspect of the invention described above.

In the method of manufacturing the semiconductor device according to one aspect of the present invention, the second metal electrode layer connected to the second impurity region and the first metal electrode layer connected to the third impurity region are formed in the separate steps, and they are insulated from each other. A direct current power source apparatus electrically connected to the first and the second metal electrode layers can be provided between the first and the second metal electrode layers. Accordingly, a semiconductor device in which on-state voltage can be reduced during conduction is obtained.

In the method of manufacturing the semiconductor device according to another aspect of the invention, a voltage drop region is formed at the surface of the second impurity region. The first metal layer is formed to extend on the voltage drop region and the third impurity region. The voltage drop region causes voltage drop during conduction, allowing application of forward bias to the pn junction between the second and the third impurity regions. A semiconductor device in which on-state voltage can be reduced is thus obtained. Different from one aspect of the invention described above, another aspect of the invention does not require two metal layers on the first major surface. The process of manufacturing can further be simplified compared with one aspect of the invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having first and second major surfaces opposite to each other, and controlling conduction/cut-off of a current flowing between said first and second major surfaces, comprising:

a semiconductor substrate having said first and second major surfaces;

a first impurity region of a first conductivity type formed extending from said first major surface into said semiconductor substrate;

a second impurity region of a second conductivity type selectively formed in said first impurity region;

a third impurity region of the first conductivity type selectively formed in said second impurity region;

a trench extending from said first major surface into said semiconductor substrate, contacting both said second and third impurity regions, and having its bottom surface in said first impurity region;

a gate electrode formed in said trench with an insulated gate layer interposed;

forward bias means for applying forward bias to a pn junction between said second and third impurity regions during conduction; and a fourth impurity region of the second conductivity type formed extending from said second major surface into said semiconductor substrate.

2. The semiconductor device according to claim 1, wherein the voltage applied to the pn junction between said second and third impurity regions by said forward bias means is lower than built-in voltage of said pn junction.

3. The semiconductor device according to claim 1, wherein a first electrode layer electrically connected to said second impurity region is formed on said first major surface, a second electrode layer electrically connected to said third impurity region is formed on said first major surface, said forward bias means includes a direct current power source electrically connected to said first and second electrode layers for maintaining potential of said second impurity region relatively higher than potential of said third impurity region, and a third electrode layer electrically connected to said fourth impurity region is formed on said second major surface.

4. The semiconductor device according to claim 3, wherein said second electrode layer is constituted by a metal layer formed to be in ohmic contact with a surface of said third impurity region, said first electrode layer is constituted by a metal layer formed to be in ohmic contact with a surface of said second impurity region, and an insulating layer is formed between said first and second electrode layers to extend from said first major surface.

5. The semiconductor device according to claim 1, wherein a first electrode layer electrically connected to said second and third impurity regions is formed on said first major surface, said forward bias means includes voltage drop means between said first electrode layer and said second impurity region, and a second electrode layer electrically connected to said fourth impurity region is formed on said second major surface.

6. The semiconductor device according to claim 5, wherein said voltage drop means includes a resistive layer having resistance higher than that of the sheet resistance of said second impurity region.

7. The semiconductor device according to claim 5, wherein said voltage drop means includes a Schottky junction portion formed between said second impurity region and said first electrode layer.

8. A semiconductor device having first and second major surfaces opposite to each other, and controlling conduction/cut-off of a current flowing between said first and second major surfaces, comprising:

a semiconductor substrate having said first and second major surfaces;

a first impurity region of a first conductivity type formed extending from said first major surface into said semiconductor substrate;

a second impurity region of a second conductivity type selectively formed extending from said first major surface into said first impurity region;

a third impurity region of the first conductivity type selectively formed extending from said first major surface into said second impurity region;

first and second trenches extending from said first major surface into said semiconductor substrate, contacting both said second and third impurity regions having its bottom surface in said first impurity region, and formed at both sides of said third impurity regions;

a third trench formed opposite to said first trench with said second trench inbetween spaced apart from said second trench, extending from said first major surface into said semiconductor substrate, and having its bottom surface in said first impurity region;

a first gate electrode formed in said first trench with a first insulated gate layer interposed;

a second gate electrode formed with a second insulated gate layer interposed, extending from said second trench via said first major surface into said third trench;

forward bias means for applying forward bias to a pn junction between said second and third impurity regions during conduction; and a fourth impurity region of the second conductivity type formed extending from said second major surface into said semiconductor substrate.

9. The semiconductor device according to claim 8, wherein voltage applied to said pn junction between said second and third impurity regions by said forward bias means is lower than built-in voltage of said pn junction.

10. The semiconductor device according to claim 8, wherein a first electrode layer electrically connected to said second impurity region is formed on said first major surface, a second electrode layer electrically connected to said third impurity region is formed on said first major surface, said forward bias means includes a direct current power source electrically connected to said first and second electrode layers for maintaining potential of said second impurity region relatively higher than potential of said third impurity region, and a third electrode layer electrically connected to said fourth impurity region is formed on said second major surface.

11. The semiconductor device according to claim 8, wherein a fifth impurity region of the second conductivity type for drawing out holes is formed opposite to said second trench with said third trench inbetween, contacting said third trench, and said fifth impurity region extends from said first major surface into said first impurity region.

12. The semiconductor device according to claim 8, comprising:

a fourth trench formed opposite to said second trench with said third trench inbetween, spaced apart from said third trench, extending from said first major surface into said semiconductor substrate, and having its bottom surface in said first impurity region;

a third gate electrode formed in said fourth trench with a third insulated gate layer interposed;

a fifth impurity region of the second conductivity type formed in said first impurity region located between said third and fourth trenches to reach said first major surface, contacting both said third and fourth trenches; and a sixth impurity region of the first conductivity type selectively formed in said fifth impurity region to reach said first major surface, contacting one of said third and fourth trenches.

13. The semiconductor device according to claim 8, wherein a fourth trench is formed between said second and third trenches extending from said first major surface into said semiconductor substrate, having its bottom surface in said first impurity region, and said second insulated gate layer and said second gate electrode extend in said fourth trench.

14. The semiconductor device according to claim 8, wherein a first electrode layer electrically connected to said second and third impurity regions is formed on said first major surface, said forward bias means includes voltage drop means formed between said second impurity region and said first electrode layer, and a second electrode layer electrically connected to said fourth impurity region is formed on said second major surface.

15. The semiconductor device according to claim 14, wherein said voltage drop means includes a resistive layer having a resistance higher than sheet resistance of said second impurity region.

16. The semiconductor device according to claim 14, wherein said voltage drop means includes a Schottky junction portion formed between said second impurity region and said first electrode layer.

* * * * *